United States Patent
Lee et al.

(10) Patent No.: US 10,971,567 B2
(45) Date of Patent: Apr. 6, 2021

(54) DISPLAY DEVICE

(71) Applicant: Samsung Display Co., Ltd., Yongin-si (KR)

(72) Inventors: Jae Hak Lee, Suwon-si (KR); Ho Kyoon Kwon, Seoul (KR); Deuk Jong Kim, Cheonan-si (KR); Dong-Hyun Lee, Suwon-si (KR); Ji Hye Heo, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 40 days.

(21) Appl. No.: 16/548,656

(22) Filed: Aug. 22, 2019

(65) Prior Publication Data

US 2019/0378885 A1 Dec. 12, 2019

Related U.S. Application Data

(63) Continuation of application No. 15/867,455, filed on Jan. 10, 2018, now Pat. No. 10,431,640.

(30) Foreign Application Priority Data

Jul. 7, 2017 (KR) ........................ 10-2017-0086700

(51) Int. Cl.
*H01L 27/32* (2006.01)
*H01L 27/15* (2006.01)
*H01L 51/00* (2006.01)

(52) U.S. Cl.
CPC ...... *H01L 27/3258* (2013.01); *H01L 27/3276* (2013.01); *H01L 27/156* (2013.01); *H01L 51/0097* (2013.01); *H01L 2251/5338* (2013.01)

(58) Field of Classification Search
None
See application file for complete search history.

(56) References Cited

U.S. PATENT DOCUMENTS

2014/0055702 A1 2/2014 Park et al.
2014/0217397 A1 8/2014 Kwak et al.
(Continued)

FOREIGN PATENT DOCUMENTS

| KR | 10-2006-0028519 A | 3/2006 |
|---|---|---|
| KR | 10-2014-0113036 A | 9/2014 |
| KR | 10-2014-0115037 A | 9/2014 |

*Primary Examiner* — Nicholas J Tobergte
*Assistant Examiner* — Kien C Ly
(74) *Attorney, Agent, or Firm* — Lewis Roca Rothgerber Christie LLP

(57) ABSTRACT

An embodiment of the present invention provides a display device including a substrate including a display area, and a peripheral area outside the display area and including a bending area, a first conductive layer including a first signal wire over the substrate, a first insulating layer over the first conductive layer, a second insulating layer in a different layer from the first insulating layer, overlapping the bending area, and having a first edge positioned around the bending area, and a protector over the second insulating layer, wherein the first signal wire is in the peripheral area, crosses the first edge of the second insulating layer, does not overlap the bending area, and includes a first portion not covered by the second insulating layer, and wherein the protector overlaps at least a portion of the first portion, and has an edge that is parallel with an edge of the first portion.

13 Claims, 27 Drawing Sheets

(56) References Cited

U.S. PATENT DOCUMENTS

| | | | |
|---|---|---|---|
| 2014/0232956 A1 | 8/2014 | Kwon et al. | |
| 2015/0060778 A1 | 3/2015 | Kim et al. | |
| 2015/0162392 A1 | 6/2015 | Lim et al. | |
| 2017/0053976 A1 | 2/2017 | Oh et al. | |
| 2017/0170206 A1 | 6/2017 | Lee et al. | |
| 2017/0194409 A1 | 7/2017 | Jeong | |
| 2017/0250242 A1 | 8/2017 | Ohara | |
| 2018/0108722 A1 | 4/2018 | Nishikawa | |
| 2018/0108723 A1* | 4/2018 | Nishimura | H01L 51/0097 |
| 2018/0120997 A1* | 5/2018 | Moon | H01L 27/3262 |
| 2018/0151662 A1* | 5/2018 | Rhe | H01L 27/3276 |
| 2019/0341442 A1* | 11/2019 | Kajiyama | H01L 51/50 |

* cited by examiner

DISPLAY DEVICE

CROSS-REFERENCE TO RELATED APPLICATION

This application is a continuation of U.S. patent application Ser. No. 15/867,455, filed Jan. 10, 2018, which claims priority to, and the benefit of, Korean Patent Application No. 10-2017-0086700 filed in the Korean Intellectual Property Office on Jul. 7, 2017, the entire contents of both of which are incorporated herein by reference.

BACKGROUND

Field

Embodiments of the present disclosure relate to a display device.

Description of the Related Art

A display device, such as a liquid crystal display (LCD) and an organic light emitting diode (OLED) display, includes a display panel including a plurality of pixels for displaying images, and a plurality of signal lines. Each pixel may include a pixel electrode for receiving a data signal, and the pixel electrode may be connected to at least one transistor to receive the data signal. The display panel may include a plurality of stacked layers. The stacked layers include at least one conductive layer and at least one insulating layer for insulation between adjacent conductive layers.

A recently developed flexible display panel also includes a bending area that may be deformed (e.g., may be bent or kinked during manufacture or use).

The above information disclosed in this Background section is only for enhancement of understanding of the background of the invention, and therefore it may contain information that does not form the prior art that is already known in this country to a person of ordinary skill in the art.

SUMMARY

Embodiments of the present invention may reduce or prevent the occurrence of defects, such as cracks in an insulating layer of a display panel, or such as corrosion of a lower conductive layer. Embodiments of the present invention may reduce or prevent the occurrence of defects in an insulating layer and/or a conductive layer that may be otherwise be caused by a structural feature of a peripheral area of a part where physical deformation occurs, such as a bending area of a display panel.

An embodiment of the present invention provides a display device including a substrate including a display area including a plurality of pixels, and a peripheral area positioned outside the display area and including a bending area, a first conductive layer including a first signal wire over the substrate, a first insulating layer over the first conductive layer, a second insulating layer in a different layer from the first insulating layer, overlapping the bending area in a plan view, and having a first edge positioned around the bending area, and a protector over the second insulating layer, wherein the first signal wire is in the peripheral area, crosses the first edge of the second insulating layer, does not overlap the bending area, and includes a first portion that is not covered by the second insulating layer, and wherein the protector overlaps at least a portion of the first portion, and has an edge that is parallel with an edge of the first portion.

The display device may further include a second conductive layer over the second insulating layer, and a third insulating layer over the second conductive layer that includes a first region having a second edge that faces the first edge of the second insulating layer, and that defines a gap between the first edge and the second edge, wherein the first signal wire includes a second portion positioned in the gap, and wherein the protector includes a first protector that overlaps at least a portion of the second portion.

The protector may include a portion that contacts an upper surface of the third insulating layer.

The second insulating layer may define an opening, wherein the first signal wire further includes a third portion in the opening, and wherein the protector further includes a second protector that overlaps at least a portion of the third portion.

At least one of the first protector and the second protector may be in the third insulating layer, and may include a same material as the third insulating layer.

The first protector may be connected with the third insulating layer in the first region.

The second conductive layer may include a second signal wire that includes a portion in the bending area and that is electrically connected to the first signal wire in the opening, wherein the first signal wire includes a first expansion in the opening, wherein the second signal wire includes a second expansion that overlaps the first expansion, and that is electrically connected to the first expansion through a contact hole of the first insulating layer, and wherein a width of the second expansion is greater than a width of the first expansion at a region where the second expansion overlaps the first expansion.

The display device may further include a third protector in the third insulating layer that overlaps the second signal wire overlapping the second insulating layer, that extends along the second signal wire, and that includes a same material as the third insulating layer.

The display device may further include a fourth insulating layer over the second conductive layer, and a third conductive layer over the fourth insulating layer, the third conductive layer including a second signal wire that includes a portion positioned in the bending area and electrically connected to the first signal wire in the opening, wherein the first signal wire includes a first expansion positioned in the opening, wherein the second signal wire includes a second expansion that overlaps the first expansion, wherein the second conductive layer includes a connecting member that overlaps the first expansion and the second expansion, wherein the first expansion is electrically connected to the connecting member through a contact hole of the first insulating layer, wherein the connecting member is electrically connected to the second expansion through a contact hole of the fourth insulating layer, and wherein a width of the connecting member is greater than a width of the first expansion at a region where the connecting member overlaps the first expansion.

The display device may further include a fourth conductive layer over the fourth insulating layer, and a third signal wire in the fourth conductive layer and alternately arranged with the first signal wire in the first region.

The second conductive layer may further include a fourth signal wire alternately arranged with the second signal wire in the bending area.

The third insulating layer may have a portion that overlaps the second conductive layer outside the first region.

At least one of the first protector and the second protector may be in the second conductive layer and may include a same material as the second conductive layer.

The second conductive layer may include a second signal wire that has a portion in the bending area, wherein the first signal wire includes a first expansion positioned in the opening, wherein the second signal wire includes a second expansion that overlaps the first expansion in the opening, and is electrically connected to the first expansion through a contact hole of the first insulating layer, and wherein a width of the second expansion is greater than a width of the first expansion at a region where the second expansion overlaps the first expansion.

The second protector may be connected with the second expansion, and the first protector may be connected with the second protector.

The third insulating layer may have a portion that overlaps the second conductive layer outside the first region.

An embodiment of the present invention provides a display device including a substrate including a display area including a plurality of pixels, and a peripheral area outside the display area and including a bending area, a first conductive layer over the substrate, a first insulating layer over the first conductive layer, a second insulating layer over the first insulating layer, overlapping the bending area in a plan view, and having a first edge positioned around the bending area, a second conductive layer over the second insulating layer, and a third insulating layer over the second conductive layer, wherein the first conductive layer includes a first signal wire in the peripheral area, extending to cross the first edge of the second insulating layer, and not overlapping the bending area, wherein the first signal wire includes a first portion that is not covered by the second insulating layer, and wherein the third insulating layer includes a protector that overlaps at least a portion of the first portion, and has an edge that is parallel with an edge of the first portion.

The protector may include a portion that contacts an upper surface of the first insulating layer.

The third insulating layer may include a first region having a second edge that faces the first edge of the second insulating layer, and defines a gap between the first edge and the second edge, wherein the first signal wire includes a second portion positioned in the gap, and wherein the protector includes a first protector that overlaps at least a portion of the second portion.

The second insulating layer may define an opening, wherein the first signal wire further includes a third portion positioned in the opening, and wherein the protector further includes a second protector that overlaps at least a portion of the third portion.

According to the embodiments of the present disclosure, it is possible to reduce or prevent defects, such as cracks in an insulating layer of a display panel, or such as corrosion of a lower conductive layer. For example, it is possible to reduce or prevent the occurrence of defects in an insulating layer and/or a conductive layer that may be easily caused by a structural feature of a peripheral area of a part where physical deformation occurs, such as a bending area of a display panel.

DETAILED DESCRIPTION

Figure 1:
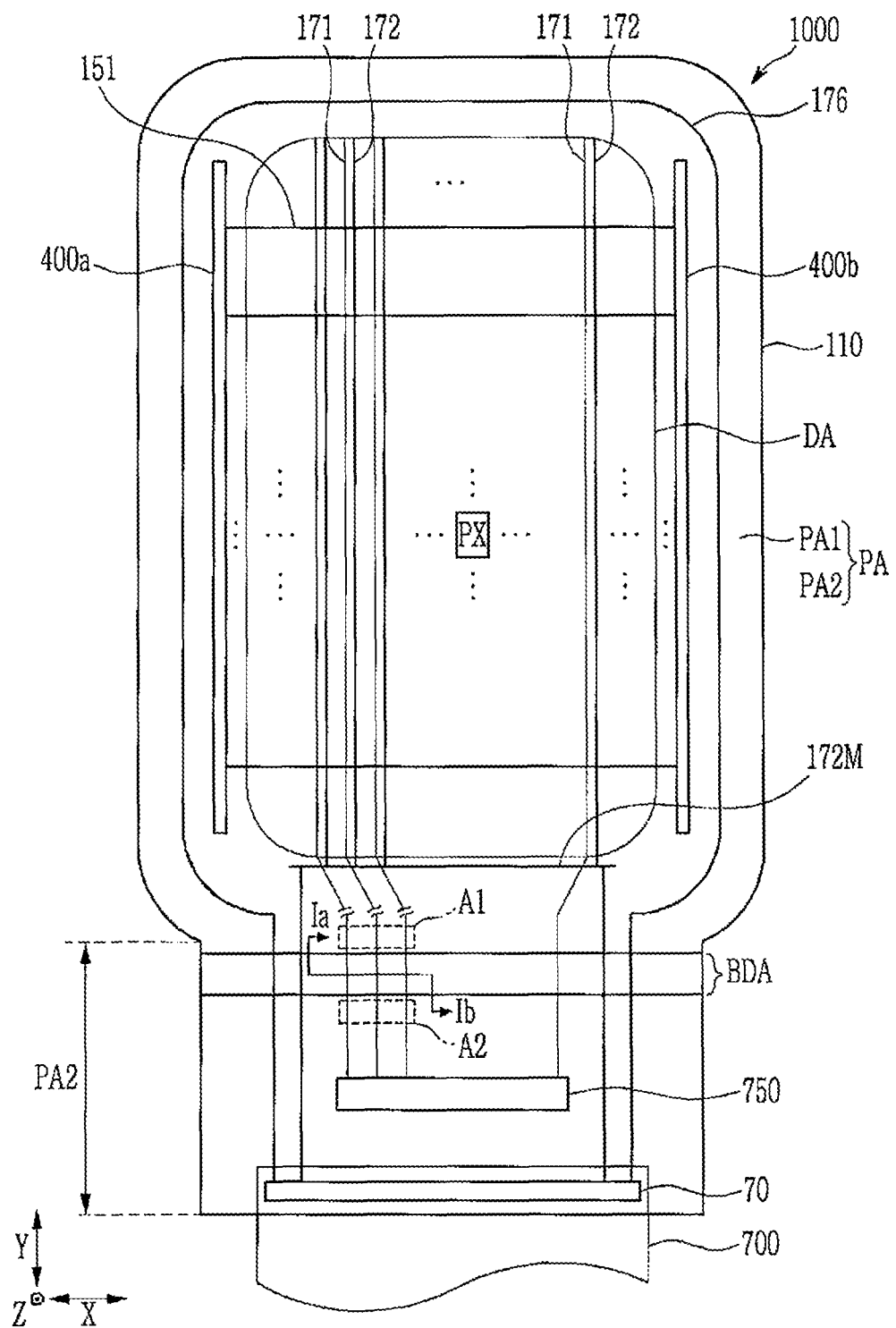
FIG. 1 is a plan layout view illustrating a display panel included in a display device according to an embodiment.

Features of the inventive concept and methods of accomplishing the same may be understood more readily by reference to the following detailed description of embodiments and the accompanying drawings. Hereinafter, embodiments will be described in more detail with reference to the accompanying drawings. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. Further, parts not related to the description of the embodiments might not be shown to make the description clear. In the drawings, the relative sizes of elements, layers, and regions may be exaggerated for clarity.

In the following description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

It will be understood that when an element, layer, region, or component is referred to as being "on," "connected to," or "coupled to" another element, layer, region, or component, it can be directly on, connected to, or coupled to the other element, layer, region, or component, or one or more intervening elements, layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

In the following examples, the X-direction, the Y-direction and the Z-direction are not limited to directions corresponding to three axes of a rectangular coordinate system, and may be interpreted in a broader sense. For example, the X-direction, the Y-direction, and the Z-direction may be perpendicular to one another, or may represent different directions that are not perpendicular to one another.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Now, a display device according to an embodiment will be described with reference to FIG. 1 to FIG. 6.

Referring to FIG. 1, the display device according to the present embodiment may include a display panel 1000 including a display area DA as an area for displaying a main image, and a peripheral area PA positioned outside the display area DA. The display panel 1000 may include a substrate 110. The peripheral area PA may include a first peripheral area PA1 around the display area DA, and a second peripheral area PA2 outside the first peripheral area PA1.

The substrate 110 may include glass, plastic, etc., and may have flexibility. For example, the substrate 110 may include a plastic such as polyethylene terephthalate (PET), polyethylene naphthalate (PEN), polycarbonate (PC), polyarylate (PAR), polyetherimide (PEI), polyethersulfone (PES), or polyimide (PI), a metal thin film, an ultra-thin glass, or the like.

The display area DA may display an image on a plane parallel to an X-direction and a Y-direction. Hereinafter, a structure observed when viewed in a Z-direction that is perpendicular to the X-direction and the Y-direction is referred to as a planar structure, and a structure viewed when cut along the Z-direction, which is perpendicular to the X-direction and the Y-direction, is referred to as a cross-sectional structure.

The display area DA includes a plurality of pixels PX and a plurality of signal lines.

The signal lines may include a plurality of gate lines 151 for transferring a gate signal, a plurality of data lines 171 for transferring a data signal, and a plurality of driving voltage lines 172 for transferring a constant voltage, such as a driving voltage ELVDD. Each of the gate lines 151 extends substantially in the X-direction in the display area DA, and may be connected to gate drivers 400a and 400b. The data lines 171 and the driving voltage lines 172 extend substantially in the Y-direction from the display area DA to one or more parts of the first peripheral area PA1.

The data lines 171 and the driving voltage lines 172 may be alternately arranged in the X-direction, but the present invention is not limited thereto.

Each pixel PX may include at least one switching element and a pixel electrode connected thereto. The switching element may be a three-terminal element such as a transistor integrated in the display panel 1000. The switching element may be turned on or off depending on a gate signal transferred by the gate line 151 to selectively transfer a data signal to the pixel electrode. In order to implement a color display, each pixel PX may display one or more colors (e.g., one of predetermined colors), and an image of a desired color may be recognized by combining images displayed by different colors. An example of the colors displayed by the plurality of pixels PX may be three primary colors of red, green, and blue, or three primary colors of yellow, cyan, and magenta, and at least one different color, such as white, may be further included in addition to the three primary colors.

The first peripheral area PA1 may be an area that is adjacent to the display area DA, and that surrounds the display area DA. The first peripheral area PA1 may include the gate drivers 400a and 400b, a voltage transfer line 176, a driving voltage transfer line 172M, and the like.

The gate drivers 400a and 400b may be connected with a plurality of gate lines 151 to transfer gate signals thereto. The gate drivers 400a and 400b may be located over the substrate 110 together with a plurality of signal lines and switching elements located in the display area DA. FIG. 1 illustrates an example in which one gate driver 400a and another gate driver 400b are located at respective opposite sides of the display area DA, but the present invention is not limited thereto. For example, one of the gate drivers 400a and 400b may be omitted.

The voltage transfer line 176 may extend along at least three sides, such as left, right, and upper sides of the display area DA, to transfer a constant voltage such as a common voltage ELVSS.

The driving voltage transfer line 172M may be adjacently located at a lower side of the display area DA to extend generally in the X-direction. The driving voltage lines 172 located in the display area DA may extend to the first peripheral area PA1, and are connected with the driving voltage transfer line 172M to receive a constant voltage such as a driving voltage ELVDD.

The second peripheral area PA2 may include a bending area BDA, a pad unit 70, a driver 750, and the like.

Figure 2:
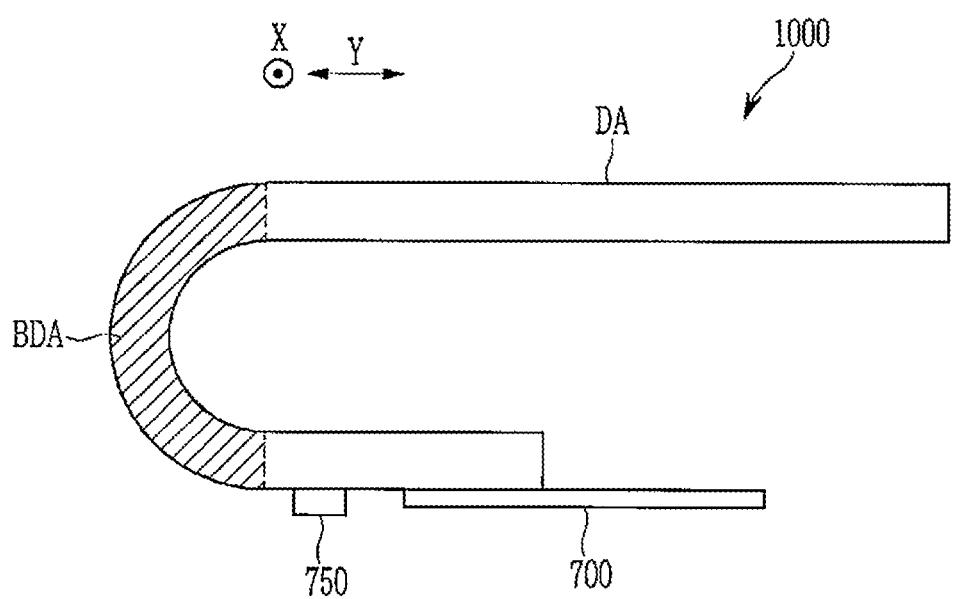
FIG. 2 illustrates a state in which a display panel is bent according to an embodiment.

Referring to FIG. 1 and FIG. 2, the bending area BDA may extend from the second peripheral area PA2 to cross the display panel 1000 in the X-direction. The display panel 1000 may be bent in the bending area BDA such that a portion positioned outside the bending area BDA may be behind the display panel 1000 to not be viewed from a front side. FIG. 1 illustrates an unfolded state in which the display panel 1000 is unfolded such that the bending area is not bent, and FIG. 2 schematically illustrates a bent state in which the display panel 1000 is bent in the bending area BDA. A plurality of wires may pass through the bending area BDA, and may extend substantially in the Y-direction in the bending area BDA.

The bending area BDA may be bendable or may be bent, and at least a portion of a region adjacent to the bending area BDA may be bendable or may be bent. In this case, a curvature radius of the region adjacent to the bending area BDA may be greater than a curvature radius of the bending area BDA.

The pad unit 70 may be located at one edge of the display panel 1000, and may be positioned outside the bending area BDA. As a result, the bending area BDA may be positioned between the display area DA and the pad unit 70. Referring to FIG. 1 and FIG. 2, the pad unit 70 may include the driver 750 and/or a plurality of pads electrically connected to a pad of a circuit layer 700. Accordingly, the display device according to the present embodiment may further include the driver 750 and/or the circuit layer 700 electrically connected to the display panel 1000 through the pad unit 70.

The voltage transfer line 176 may extend to the second peripheral area PA2 while passing through the bending area BDA to be connected with the pad unit 70.

The driving voltage transfer line 172M may be connected with the pad unit 70 through an additional wire to receive a constant voltage such as the driving voltage ELVDD.

As shown in FIG. 1 and FIG. 2, the driver 750 may be located on the display panel 1000. Alternatively, the driver 750 may be located on the circuit layer 700. The driver 750 may include a driving circuit that generates a driving signal for driving the display panel 1000. The data lines 171 located in the display area DA may extend to the first peripheral area PA1. The adjacent data lines 171 having a narrowed interval therebetween in the first peripheral area PA1 may be connected with the driver 750 after passing through the bending area BDA.

The circuit layer 700 may have a film-like form. Referring to FIG. 1 and FIG. 2, the circuit layer 700 may be connected with the pad unit 70 at an edge of the second peripheral area PA2 of the display panel 1000. A driver, a timing controller, and the like may be located in the circuit layer 700.

Hereinafter, a detailed structure of the display panel 1000 will be described with reference to FIGS. 3 to 6 in addition to FIG. 1 and FIG. 2. For example, detailed structures of areas A1 and A2 adjacent to the bending area BDA will be described. Although the planar structure will be described by confining it to the areas A1 and A2 adjacent to the bending area BDA, most of the layers described in the cross-sectional structure may be positioned throughout the display panel 1000.

First, planar structures of the areas A1 and A2 of the display panel 1000 will be described mainly with reference to FIG. 3, and then a cross-sectional structure of the display panel 1000 will be described mainly with reference to FIG. 4 to FIG. 6.

Figure 3:
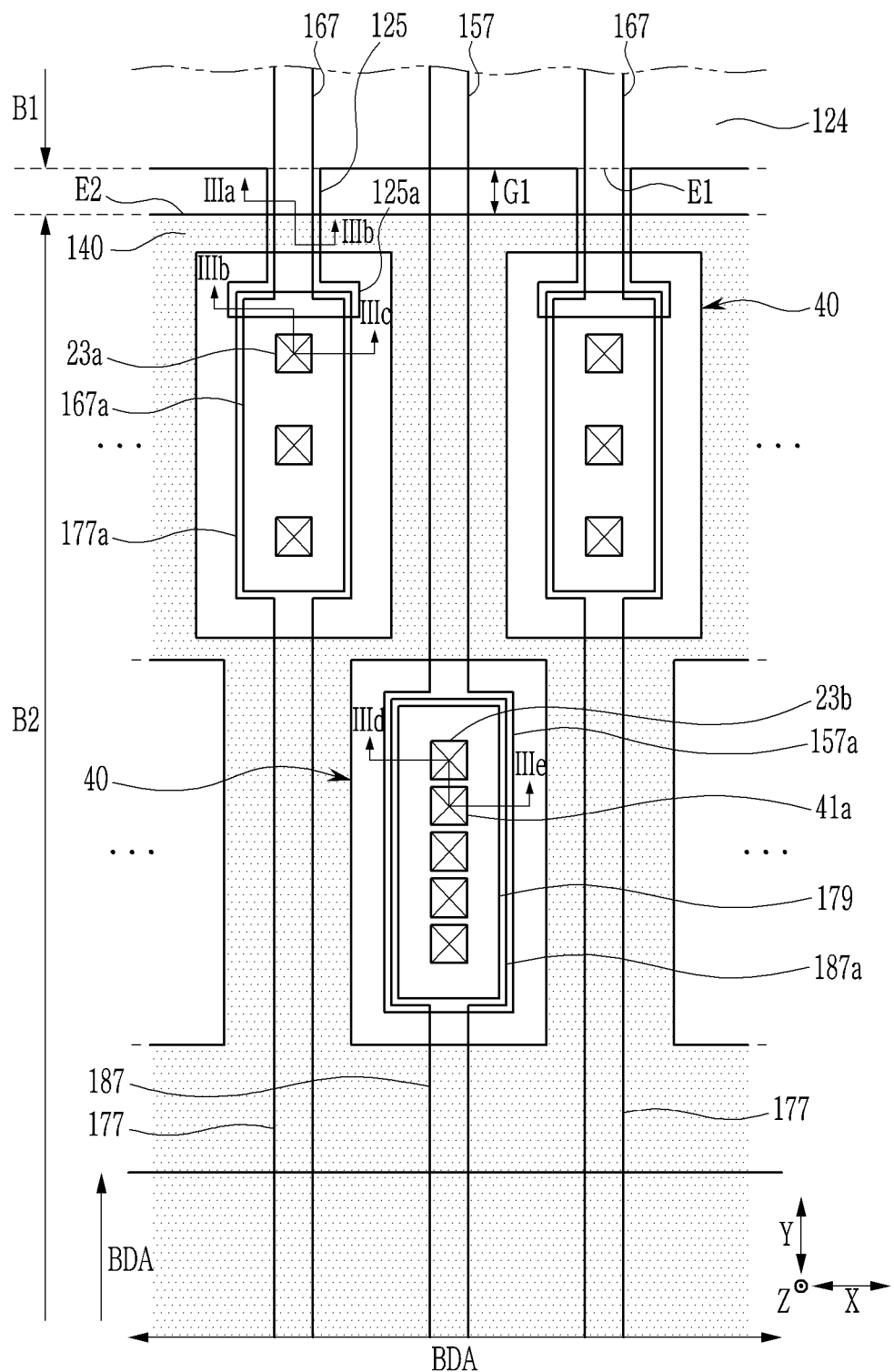
FIG. 3 is a plan layout view expanding an area A1 or A2 of the display panel illustrated in FIG. 1.

FIG. 3 is a plan layout view expanding the areas A1 and A2 of the display panel 1000, which are adjacent to the bending area BDA illustrated in FIG. 1. The area A1 adjacently above the bending area BDA, and the area A2 adjacently below the bending area BDA, may have shapes that are substantially symmetrical with respect to a horizontal central line of the bending area BDA. The area A1 may be positioned in the peripheral area PA between the display area DA and the bending area BDA, and the area A2 may be positioned in the peripheral area PA between the bending area BDA and the pad unit 70. An enlarged disposal diagram of the area A1 may be the same as that of FIG. 3, and an enlarged disposal diagram of the area A2 may be the same as a drawing obtained by rotating FIG. 3. Herein, the description will be made mainly based on the area A1.

Referring to FIG. 1 and FIG. 3, different conductive layers may be electrically connected to each other in the area A1 adjacent to the bending area BDA. For example, a first signal wire 157 and a second signal wire 167 extended from above on the basis of FIG. 3 are respectively electrically connected to a third signal wire 177 and a fourth signal wire 187 extended from below. Each of the first, second, third, and fourth signal wires 157, 167, 177, and 187 may extend substantially in the Y-direction.

The first signal wire 157 and the second signal wire 167 may be included in the data lines 171, but the present invention is not limited thereto. For example, the first signal wire 157 and the second signal wire 167 may be included in signal lines for transferring different driving signals.

The third signal wire 177 and the fourth signal wire 187 may extend below to pass through the bending area BDA described above.

The first signal wire 157 and the second signal wire 167 may be alternately arranged in the X-direction, and may be located at different conductive layers, but the present invention is not limited thereto. For example, the first signal wire 157 and the second signal wire 167 may be located at a same conductive layer depending on a design condition. Similarly, the third signal wire 177 and the fourth signal wire 187 may be alternately arranged in the X-direction, and may be located at different conductive layers, but the present invention is not limited thereto. For example, the third signal wire 177 and the fourth signal wire 187 may be located at a same conductive layer depending on a design condition.

The first signal wire 157 may include an expansion 157*a* positioned at an end portion thereof, the second signal wire 167 may include an expansion 167*a* positioned at an end portion thereof, the third signal wire 177 may include an expansion 177*a* positioned at an end portion thereof, and the fourth signal wire 187 may include an expansion 187*a* at an end portion thereof.

The expansion 167*a* of the second signal wire 167 may overlap the expansion 177*a* of the third signal wire 177 in a plan view to be electrically connected thereto through a contact hole 23*a* of an insulating layer. The expansion 157*a* of the first signal wire 157 may overlap the expansion 187*a* of the fourth signal wire 187 and a connecting member 179 of the third conductive layer in a plan view. The expansion 157a and the expansion 187a may be electrically connected to each other through contact holes 23b and 41a of the insulating layer therebetween.

A plurality of expansions 167a and a plurality of expansions 177a may be arranged in the X-direction to constitute a first row, a plurality of expansions 157a and a plurality of expansions 187a may be arranged in the X-direction to constitute a second row, and the first row and the second row may constitute different rows that are not overlapped. The first signal wire 157 and the second signal wire 167 are alternately arranged in the X-direction, and the third signal wire 177 and the fourth signal wire 187 are alternately arranged in the X-direction. Accordingly, the expansions 157a, 167a, 177a, and 187a may be alternately arranged at the first row and the second row. Thus, the signal wires 157, 167, 177, and 187 and/or the expansions 157a, 167a, 177a, and 187a may be effectively located in a limited region in a plan view. In addition, the signal wires 157, 167, 177, and 187 may be located in different conductive layers to reduce intervals between respective adjacent signal wires 157, 167, 177, and 187, thereby efficiently using a limited space.

Hereinafter, the cross-sectional structure of the display panel 1000 will be described with reference to FIGS. 4 to 6 in addition to FIG. 3.

A barrier layer 120 may be located over the substrate 110. The barrier layer 120 may include a plurality of layers as illustrated, or may be a single layer.

An active pattern is located over the barrier layer 120. The active pattern may include portions positioned in the display area DA and the peripheral area PA. The active pattern may include a source region and a drain region which are conductive regions, and a channel region positioned therebetween. The active pattern may include amorphous silicon, polysilicon, an oxide semiconductor, or the like. An example of the active pattern of the pixel PX will be described.

A first insulating layer 121 is located over the active pattern, and a first conductive layer is located over the first insulating layer 121. The first conductive layer may include a conductor configured to overlap the active pattern, and the first signal wire 157 or the second signal wire 167. Herein, an example in which the first signal wire 157 is positioned in the first conductive layer will be described (e.g., see FIG. 5).

A second insulating layer 122 may be located over the first conductive layer and the first insulating layer 121, and a second conductive layer may be located over the second insulating layer 122. The second conductive layer may include the second signal wire 167. Alternatively, the first signal wire 157 may be positioned in the second conductive layer, and the second signal wire 167 may be positioned in the first conductive layer.

A third insulating layer 123 may be located over the second conductive layer and second insulating layer 122. The third insulating layer 123 may include the contact hole 23a described above, and the second and third insulating layers 122 and 123 may include the contact hole 23b described above.

At least one of the first insulating layer 121, the second insulating layer 122, and the third insulating layer 123 may include an inorganic insulating material, such as a silicon nitride (SiNx), a silicon oxide (SiOx), a silicon oxynitride (SiON), or the like, and/or an organic insulating material.

Figure 6:
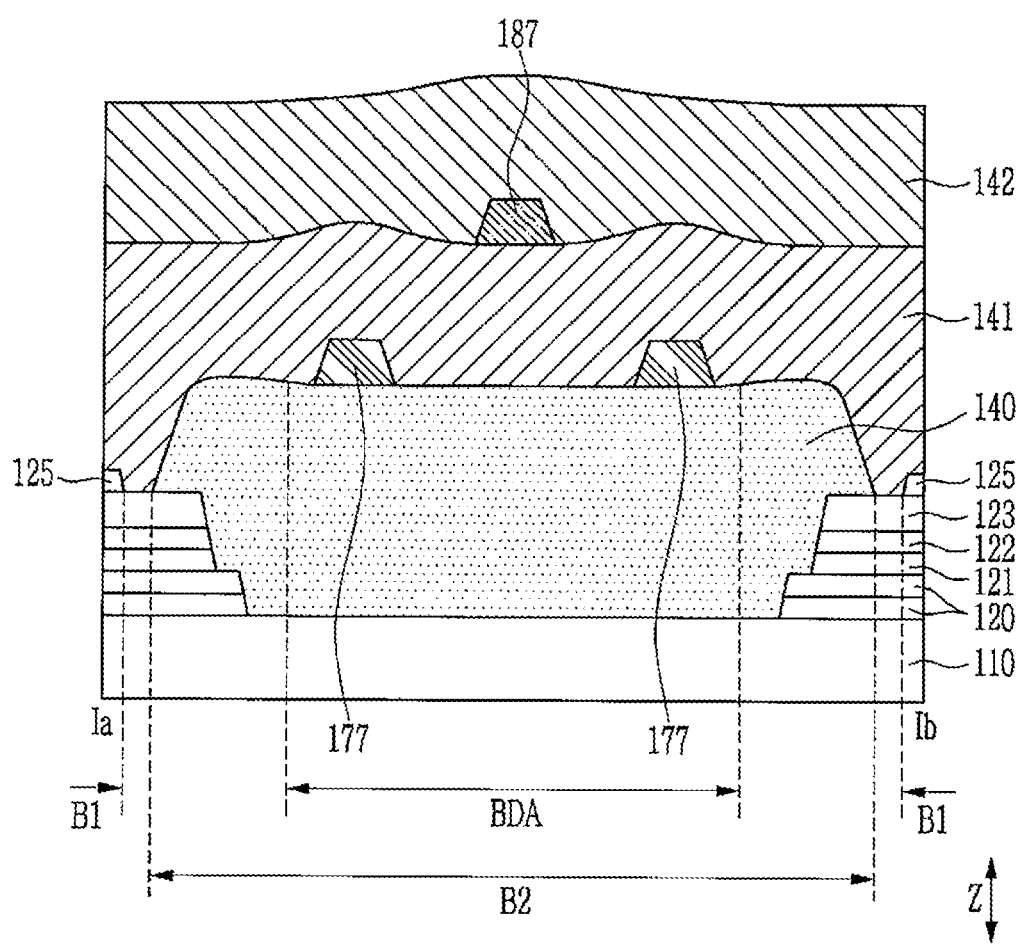
FIG. 6 is a cross-sectional view taken along the line Ia-Ib illustrating the display panel according to the embodiment of FIG. 3.

Referring to FIG. 6, at least one of the barrier layer 120, the first insulating layer 121, the second insulating layer 122, and the third insulating layer 123 is removed from the bending area BDA and a region adjacent to the bending area BDA. FIG. 6 illustrates an example in which all of the barrier layer 120, the first insulating layer 121, the second insulating layer 122, and the third insulating layer 123 are removed in the bending area BDA and the region adjacent to the bending area BDA.

A fourth insulating layer 140 may be located over the third insulating layer 123. Referring to FIG. 6, the fourth insulating layer 140 may be located mainly in the bending area BDA to protect the bending area BDA by covering a top surface of the substrate 110 in which the barrier layer 120, the first insulating layer 121, the second insulating layer 122, and the third insulating layer 123 are removed. An edge region of the fourth insulating layer 140 may overlap an edge of the third insulating layer 123 in the region adjacent to the bending area BDA. A region in which the fourth insulating layer 140 is formed is referred to as a second region B2. The second region B2 may entirely cover, or include, the bending area BDA by entirely overlapping the bending area BDA, and may have a planar area that is wider than that of the bending area BDA.

Referring to FIG. 3, the second region B2 may also include portions at which the first signal wire 157 and the second signal wire 167 are respectively electrically connected to the fourth signal wire 187 and the third signal wire 177 (i.e., regions in which the expansions 157a, 167a, 177a, and 187a are positioned). An edge E2 (also referred to as an outer boundary) of the second area B2 is farther away from the bending area BDA than the expansions 157a, 167a, 177a, and 187a, and may cross the first signal wire 157 and the second signal wire 167 in the X-direction.

The fourth insulating layer 140 includes openings 40 that are positioned over and overlap the respective expansions 157a, 167a, 177a, and 187a and peripheral areas thereof. In a plan view, the opening 40 may overlap a portion of the second signal wire 167 positioned in the second conductive layer.

A third conductive layer may be located over the third insulating layer 123 and the fourth insulating layer 140. The third conductive layer may include a conductor connected with a source region or a drain region of the active pattern, the voltage transfer line 176, the data line 171, the driving voltage line 172, the third signal wire 177, and the connecting member 179 described above. Referring to FIG. 5, the connecting member 179 may be electrically connected to the expansion 157a of the first signal wire 157 through the contact hole 23b.

A fifth insulating layer 124 may be located over the third conductive layer. The fifth insulating layer 124 may be formed mainly in regions other than the bending area BDA and the region adjacent to the bending area BDA, but need not be formed entirely in the bending area BDA and the region adjacent to the bending area BDA, and may be patterned in a limited portion if necessary. A region where the fifth insulating layer 124 is generally formed, or nearly entirely formed, is referred to as a first region B1. The first region B1 does not overlap the bending area BDA, and might not overlap a portion at which the first signal wire 157 and the second signal wire 167 are respectively electrically connected to the fourth signal wire 187 and the third signal wire 177 (i.e., a region in which the expansions 157a, 167a, 177a, and 187a are located). The fifth insulating layer 124 that is continuous in the first region B1 may overlap the first and second signal wires 157 and 167.

As shown in FIG. 3, the first region B1 is separated from the second region B2. An edge E1 of the first region B1 and an edge E2 of the second region B2 may be substantially parallel to each other at a regular interval in a plan view. The edge of the first region B1 may cross the first signal wire 157 and the second signal wire 167 in the X-direction. In a plan view, a gap G1 between the edge of the first region B1 and the edge E2 of the second region B2 may overlap a portion of the second signal wire 167 positioned in the second conductive layer.

The fifth insulating layer 124 may include an inorganic insulating material such as a silicon nitride (SiNx), a silicon oxide (SiOx), a silicon oxynitride (SiON), and/or an organic insulating material.

A sixth insulating layer 141 may be located over the fifth insulating layer 124. The sixth insulating layer 141 may include the contact hole 41a located over the connecting member 179. In the plan view shown in FIG. 3, the contact hole 41a and the contact hole 23b might not overlap each other, and may be alternately arranged in the Y-direction.

A fourth conductive layer may be located over the sixth insulating layer 141. The fourth conductive layer may include the fourth signal wire 187. Referring to FIG. 5, the expansion 187a of the fourth signal wire 187 may be electrically connected to the connecting member 179 through the contact hole 41a.

The driving voltage line 172 described above may include a wire positioned in the fourth conductive layer. For example, the driving voltage line 172 may include a first wire positioned in the third conductive layer and a second wire positioned in the fourth conductive layer, which may be electrically connected to each other through holes (e.g., holes of the fifth insulating layer 124 and the sixth insulating layer 141). The voltage transfer line 176, the data lines 171, and the like may be positioned in the fourth conductive layer instead of the third conductive layer.

A seventh insulating layer 142 may be located over the sixth insulating layer 141 and the fourth conductive layer.

At least one of the fourth insulating layer 140, the sixth insulating layer 141, and the seventh insulating layer 142 includes an inorganic insulating material and/or an organic insulating material such as a polyimide, an acrylic polymer, a siloxane polymer, or the like.

At least one of the first conductive layer, the second conductive layer, the third conductive layer, and the fourth conductive layer may include at least one of metals such as copper (Cu), aluminum (Al), magnesium (Mg), silver (Ag), gold (Au), platinum (Pt), palladium (Pd), nickel (Ni), neodymium (Nd), molybdenum (Mo), tungsten (W), titanium (Ti), chromium (Cr), tantalum (Ta), and alloys thereof. Each of the first conductive layer, the second conductive layer, the third conductive layer, and the fourth conductive layer may include a single layer or multiple layers.

Figure 4:
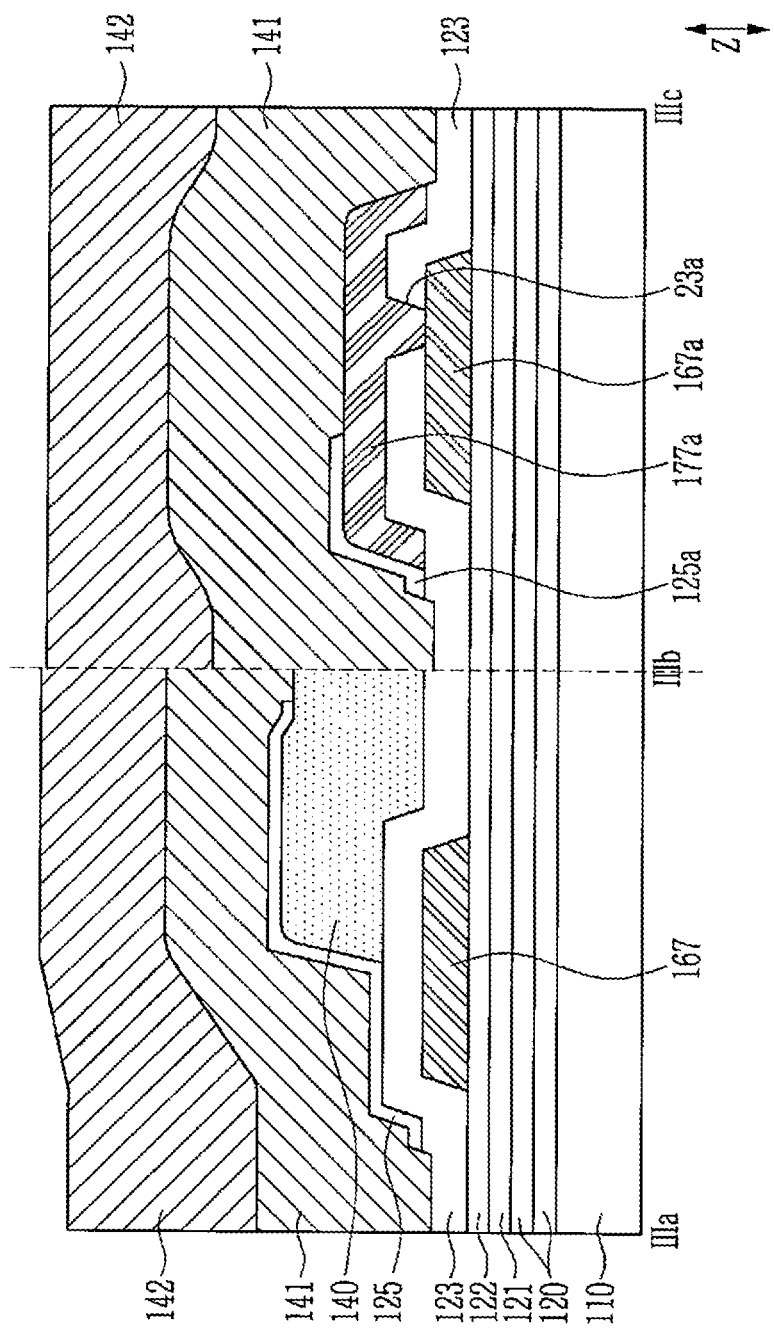
FIG. 4 is a cross-sectional view taken along the line IIIa-IIIb-IIIc illustrating the display panel according to the embodiment of FIG. 3.
Figure 5:
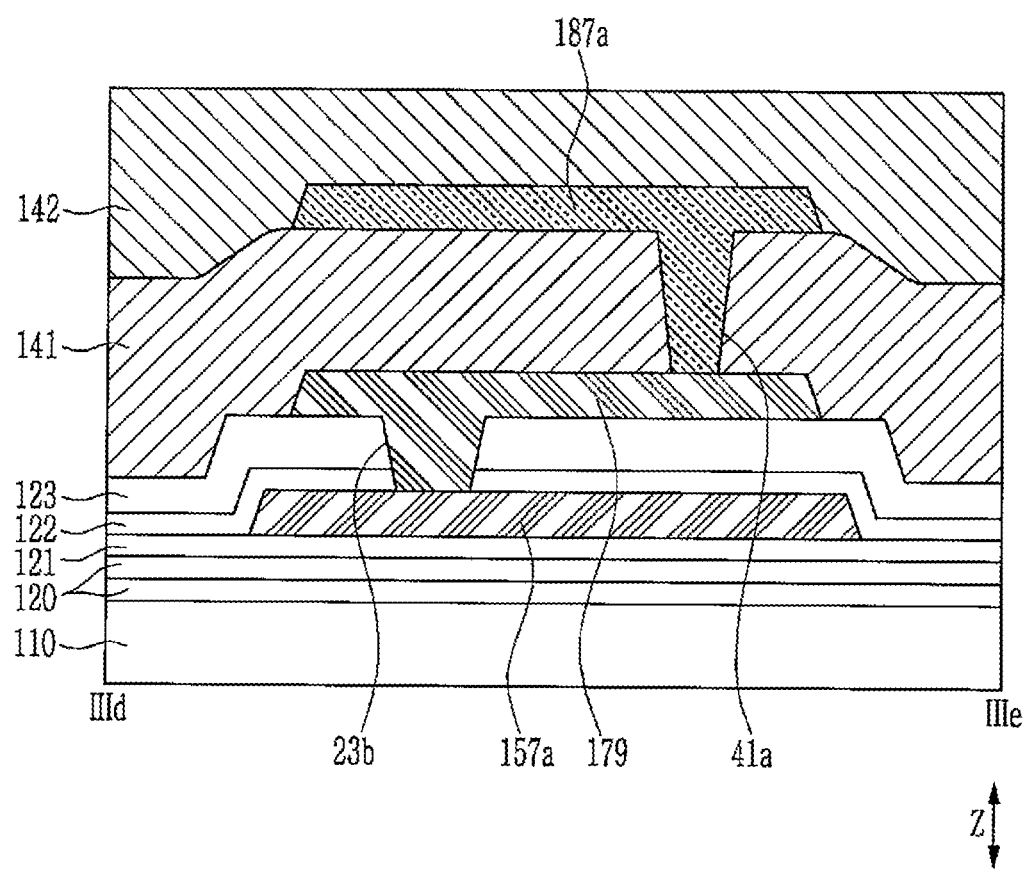
FIG. 5 is a cross-sectional view taken along the line taken along the line IIId-IIIe illustrating the display panel according to the embodiment of FIG. 3.

Referring to FIG. 3 to FIG. 5, the fifth insulating layer 124 may include a protector 125 located in the gap G1 and in the second region B2. The protector 125 may have a shape that protrudes from the fifth insulating layer 124 located in the first region B1 in a plan view. In other words, the protector 125 may have a shape that downwardly protrudes from the edge of the first region B1. Of the second signal wire 167 positioned in the second conductive layer, the protector 125 may overlap and cover the portion located in the gap G1, and the portion overlapping the opening 40 of the fourth insulating layer 140, while not overlapping the third signal wire 177 that is part of the third conductive layer, and a periphery thereof. Herein, the periphery of a portion indicates an area (e.g., a predetermined area) outside an edge of the portion, and this is true hereinafter.

In other words, a portion of the second signal wire 167 in the gap G1 and a portion of the second signal wire 167 that overlaps the opening 40 of the fourth insulating layer 140, but does not overlap the third signal wire 177 serving as the third conductive layer, may be positioned in a region occupied by the protector 125. A width of the protector 125 may be greater than that of the second signal wire 167 at a portion where the protector 125 overlaps the second signal wire 167. Herein, the width may generally indicate an X-directional width, but the present invention is not limited thereto. For example, the width may be a Y-directional width. This is true hereinafter. An edge of the protector 125 may extend in parallel with edges of portions of the second signal wire 167 (e.g., in the gap G1 and overlapping the opening 40 of the fourth insulating layer 140 but not overlapping the third signal wire 177 serving as the third conductive layer).

The protector 125 may include an expansion 125a that overlaps a portion of the expansion 167a of the second signal wire 167. A width of the expansion 125a may be greater than that of the expansion 167a at a portion where the expansion 125a overlaps the expansion 167a of the second signal wire 167. In the present embodiment, the expansion 125a does not overlap the contact hole 23a.

The protector 125 may have a portion that contacts an upper surface of the third insulating layer 123.

In a manufacturing process of the display panel 1000, when the protector 125 is not used, the third insulating layer 123 located over the above-described portions of the second signal wire 167 may be partially etched, and thus may be easily thinned during patterning of the third conductive layer and/or patterning of the fifth insulating layer 124. The thinned third insulating layer 123 may be easily cracked to generate cracks in the third insulating layer 123, and a second conductive layer such as the second signal wire 167 located thereunder may be corroded by moisture and the like, which leads to faults of the display panel 1000. The third insulating layer 123 located at a portion of the second signal wire 167 positioned in the first region B1, or located at a portion covered by the fourth insulating layer 140 instead of the opening 40 and an upper portion of a periphery thereof, may be protected by the fourth insulating layer 140 and/or the fifth insulating layer 124 during the patterning of the third conductive layer and/or the patterning of the fifth insulating layer 124, thereby reducing the above risks.

However, according to the present embodiment, because the protector 125 overlaps and covers among the second signal wire 167 positioned in the second conductive layer, the portion located in the gap G1, the portion overlapping the opening 40 of the fourth insulating layer 140 while not covering the third signal wire 177 which is the third conductive layer, and a periphery thereof, the third insulating layer 123 located over the second signal wire 167 may be protected to maintain its thickness without being etched during the patterning of the third conductive layer and/or the patterning of the fifth insulating layer 124. Therefore, a defect such as a crack may be reduced or prevented from occurring in the third insulating layer 123 located around the second signal wire 167, or the second conductive layer such as the second signal wire 167 may be prevented from being defective due to being corroded by moisture and the like.

Referring to FIG. 3 and FIG. 4, the third insulating layer 123 located in the expansion 167a of the second signal wire 167 that is positioned in the opening 40 and is not covered by the protector 125, and an upper portion of a periphery thereof, may be protected by the expansion 177a of the third signal wire 177 that is a part of the third conductive layer. The third signal wire 177 includes a plurality of third signal wires 177. A width of expansions 177a of the third signal wires 177 that overlap each other may be greater than that of the expansion 167a of the second signal wire 167. An edge of the expansion 177a may extend in parallel with the edge of the expansion 167a.

For example, because the expansion 177a of the third signal wire 177, which is the third conductive layer, covers the expansion 167a of the second signal wire 167, which is the second conductive layer, positioned in the opening 40, and also covers a periphery thereof, the third insulating layer 123 located in the expansion 167a of the second signal wire 167 may be protected to maintain its thickness without being etched during the patterning of the third conductive layer and/or the patterning of the fifth insulating layer 124. Therefore, a defect such as a crack may be reduced or prevented from occurring in the third insulating layer 123 located around the expansion 167a, or the expansion 167a may be prevented from being defective due to being corroded by moisture and the like.

Hereinafter, a detailed structure of one pixel PX included in a display device according to an embodiment will be described with reference to FIG. 7 to FIG. 9 as well as the aforementioned drawings.

The display device according to an embodiment includes a first scan line 151a for transferring a scan signal, a second scan line 151b, a third scan line 151c, and a control line 151d for transferring a light control signal. The plurality of scan lines 151a, 151b, and 151c and the control line 151d may be included in the aforementioned gate lines 151, and may be included in the first conductive layer described above on the cross-sectional structure.

The display device according to an embodiment may further include a storage line 166, an initialization voltage line 169 for transferring an initialization voltage, and the like, and they may be included in the second conductive layer described above on the cross-sectional structure. The storage line 166 may include an expansion 66 positioned in each pixel PX.

In a plan view, the data lines 171 and the driving voltage lines 172 may extend in a substantially same direction (e.g., Y-direction in FIG. 7) to cross the scan lines 151a, 151b, and 151c. The expansion 66 of the storage line 166 may be connected with the driving voltage lines 172 through a contact hole 68 to receive the driving voltage ELVDD.

Each pixel PX may include the scan lines 151a, 151b, and 151c, the control line 151d, a plurality of transistors T1, T2, T3_1, T3_2, T4_1, T4_2, T5, T6, and T7 connected with the data lines 171 and the driving voltage lines 172, and a capacitor Cst. Each channel of the transistors T1, T2, T3_1, T3_2, T4_1, T4_2, T5, T6, and T7 may be formed in an active pattern 130. The active pattern 130 includes channel regions 131a, 131b, 131c_1, 131c_2, 131d_1, 131d_2, 131e, 131f, and 131g for forming each channel of the transistors T1, T2, T3_1, T3_2, T4_1, T4_2, T5, T6, and T7, and conductive regions. The conductive regions of the active pattern 130 are positioned at opposite sides of each of the channel regions 131a, 131b, 131c_1, 131c_2, 131d_1, 131d_2, 131e, 131f, and 131g to have a carrier concentration that is higher than that of the channel regions 131a, 131b, 131c_1, 131c_2, 131d_1, 131d_2, 131e, 131f, and 131g. The pair of conductive regions positioned at the opposite sides of each of the channel region 131a, 131b, 131c_1, 131c_2, 131d_1, 131d_2, 131e, 131f, and 131g of the transistors T1, T2, T3_1, T3_2, T4_1, T4_2, T5, T6, and T7 may respectively be a source region and a drain region of the corresponding transistors T1, T2, T3_1, T3_2, T4_1, T4_2, T5, T6, or T7 to serve as a source electrode and a drain electrode.

The first transistor T1 includes the channel region 131a, a source region 136a, a drain region 137a, and a driving gate electrode 155a. The driving gate electrode 155a may be included in the first conductive layer, and may be connected with a connecting member 74 through a contact hole 61. The connecting member 74 may be included in the third conductive layer described above on the cross-sectional structure. The contact hole 61 may be within a contact hole 51 included in the expansion 66 in a plan view.

The second transistor T2 includes the channel region 131b, a source region 136b, and a drain region 137b, and a gate electrode 155b that is a portion of the first scan line 151a. The source region 136b is connected with the data line 171 through a contact hole 62, and the drain region 137b is connected with the source region 136a of the first transistor T1.

The third transistors T3_1 and T3_2 may include an upper third transistor T3_1 and a lower third transistor T3_2 connected with each other. The upper third transistor T3_1 includes the channel region 131c_1, a source region 136c_1, a drain region 137c_1, and a gate electrode 155c_1 that is a portion of the first scan line 151a. The drain region 137c_1 is connected with the connecting member 74 through a contact hole 63. The lower third transistor T3_2 includes the channel region 131c_2, a source region 136c_2, and a drain region 137c_2, and a gate electrode 155c_2 which is a portion of the first scan line 151a.

The fourth transistor T4_1 and T4_2 may include a left fourth transistor T4_1 and a right fourth transistor T4_2, which are connected with each other. The left fourth transistor T4_1 includes the channel region 131d_1, a source region 136d_1, a drain region 137d_1, and a gate electrode 155d_1 that is a portion of the second scan line 151b. The drain region 137d_1 is connected with the drain region 137c_1 of the upper third transistor T3_1, and is connected with the connecting member 74 through the contact hole 63. The right fourth transistor T4_2 includes the channel region 131d_2, a source region 136d_2, a drain region 137d_2, and a gate electrode 155d_2 that is a portion of the second scan line 151b. The drain region 137d_2 is connected with the source region 136d_1 of the left fourth transistor T4_1, and the source region 136d_2 is connected with a connecting member 75 through a contact hole 65. The connecting member 75 may be included in the second conductive layer or the third conductive layer described above on the cross-sectional structure. When the connecting member 75 is included in the third conductive layer, the connecting member 75 may be electrically connected to the initialization voltage line 169 through a contact hole 64.

The fifth transistor T5 includes the channel region 131e, a source region 136e, a drain region 137e, and a gate electrode 155e that is a portion of the control line 151d. The source region 136e is connected with the driving voltage line 172 through a contact hole 67, and the drain region 137e is connected with the source region 136a of the first transistor T1.

The sixth transistor T6 includes the channel region 131f, a source region 136f, a drain region 137f, and a gate electrode 155f that is a portion of the control line 151d. The source region 136f is connected with the drain region 137a of the first transistor T1, and the drain region 137f is connected with a connecting member 79 through a contact hole 69. The connecting member 79 may be included in the third conductive layer described above on the cross-sectional structure.

The seventh transistor T7 includes the channel region 131g, a source region 136g, a drain region 137g, and a gate electrode 155g of the third scan line 151c. The source region 136g is connected with the drain region 137f of the sixth transistor T6, and the drain region 137g is connected with the connecting member 75 through the contact hole 65 to receive an initialization voltage.

The capacitor Cst may include the driving gate electrode 155a and the expansion 66 of the storage line 166, which overlap each other with the second insulating layer 122 therebetween as two terminals.

The cross-sectional structure of the pixel PX will be further described. A pixel electrode layer is located over the seventh insulating layer 142. The pixel electrode layer includes a pixel electrode 191 located in each pixel PX of the display area DA, and a pixel conductive pattern 192. The pixel electrode 191 may be connected with the connecting member 79 through a contact hole 89 to receive a data voltage. The pixel conductive pattern 192 may be bent along an edge of the adjacent pixel electrode 191. The pixel conductive pattern 192 may transfer an initialization voltage. The pixel electrode layer may include a transflective conductive material or a reflective conductive material.

A pixel defining layer 350 is located over the seventh insulating layer 142 and the pixel electrode layer. The pixel defining layer 350 may have an opening 351 located on the pixel electrode 191. The pixel defining layer 350 may include an organic insulating material such as a polyacryl-based resin or a polyimide-based resin.

An emission layer 370 is located over the pixel electrode 191. The emission layer 370 may include a portion positioned in the opening 351 of the pixel defining layer 350. The emission layer 370 may include an organic light emitting material or an inorganic light emitting material.

A common electrode 270 is positioned over the emission layer 370. The common electrode 270 may also be located over the pixel defining layer 350 to be continuously formed over the plurality of pixels. The common electrode 270 may be connected to the voltage transfer line 176 in the peripheral area PA to receive the common voltage ELVSS. The common electrode 270 may include a conductive transparent material.

Figure 7:
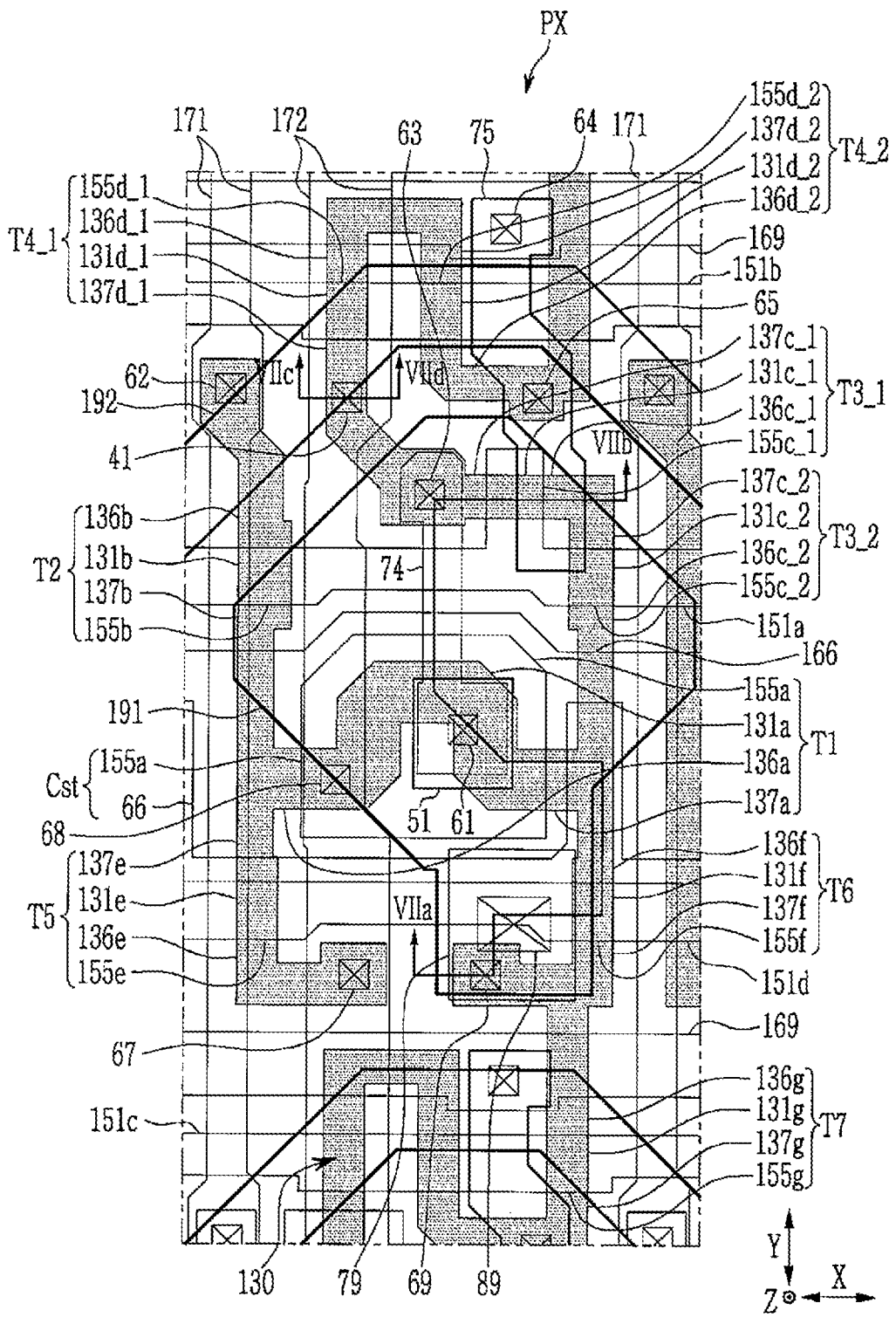
FIG. 7 is a plan layout view illustrating one pixel of a display device according to an embodiment.
Figure 8:
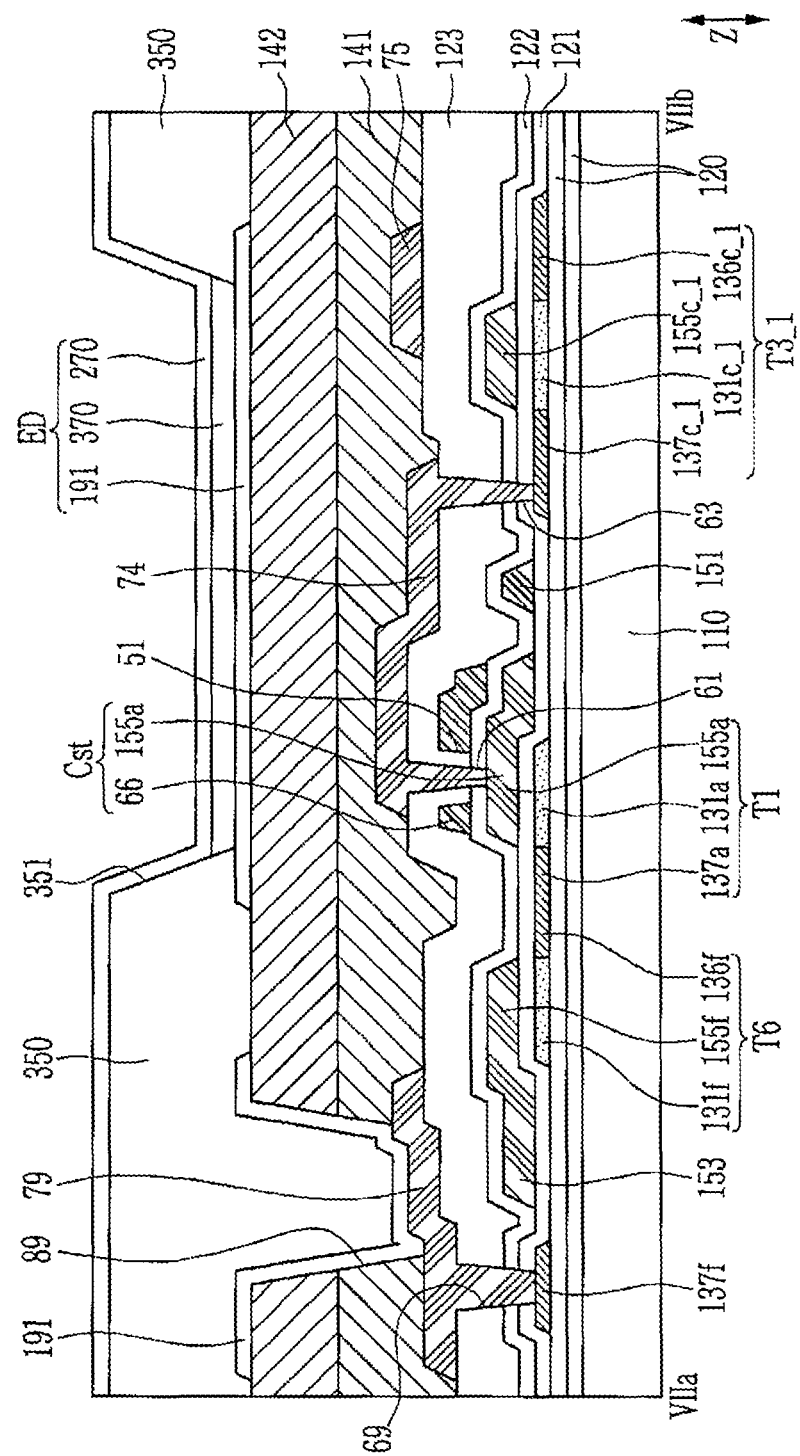
FIG. 8 is a cross-sectional view taken along the line VIIa-VIIb illustrating the pixel according to the embodiment of FIG. 7.
Figure 9:
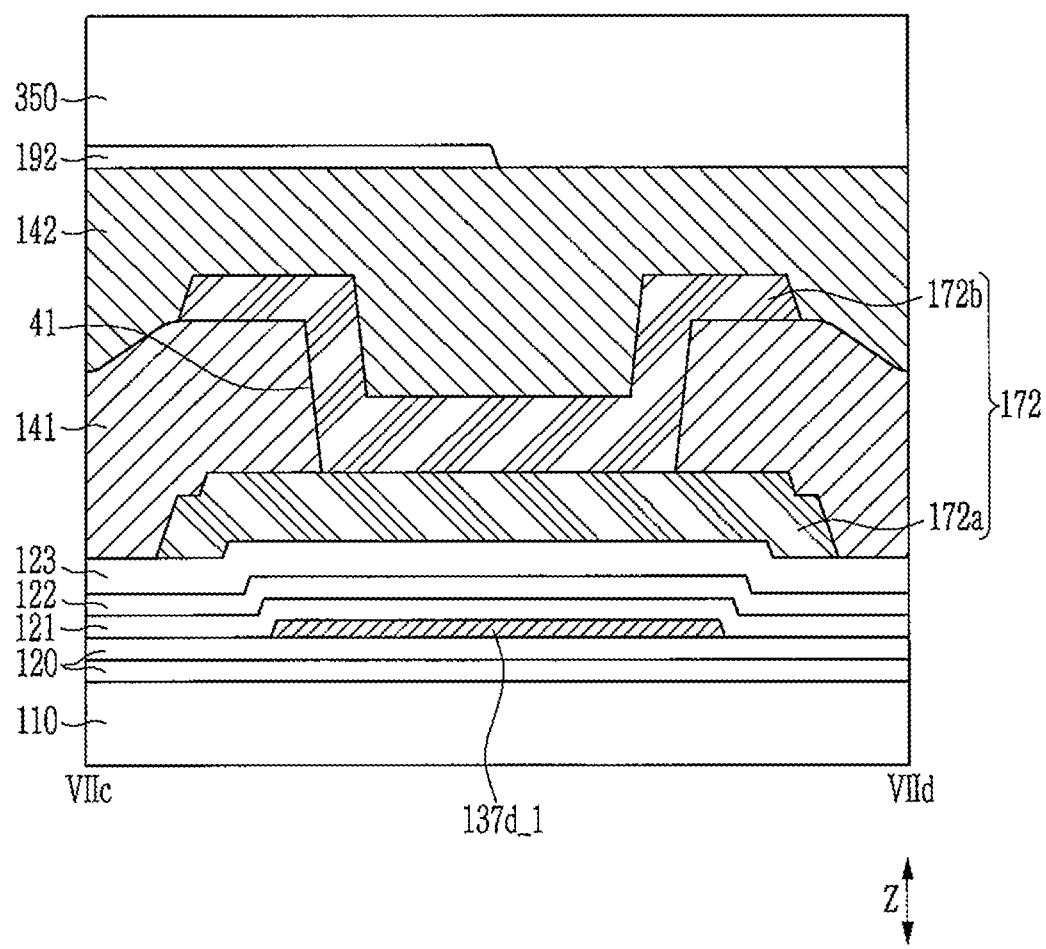
FIG. 9 is a cross-sectional view taken along the line VIIc-VIId illustrating the pixel according to the embodiment of FIG. 7.

The pixel electrode 191, the emission layer 370, and the common electrode 270 of each pixel PX together constitute a light emitting diode ED, and one of the pixel electrode 191 and the common electrode 270 becomes a cathode, while the other becomes an anode Referring to FIG. 7 and FIG. 9, some signal lines may include a plurality of wires positioned in at least two conductive layers. For example, the driving voltage line 172, as shown in FIG. 9, may include a first wire 172a positioned in the third conductive layer and a second wire 172b positioned in the fourth conductive layer. The first wire 172a and the second wire 172b may be electrically connected to each other through a plurality of contact holes 41 of the sixth insulating layer 141, and may have a substantially same planar shape in a plan view. As such, a wire resistance may be reduced by allowing the driving voltage line 172 positioned in the display area DA to include multiple wires, so that a substantially constant driving voltage ELVDD can be transmitted throughout the display area DA.

Hereinafter, various structures of the areas A1 and A2 of the display panel 1000 will be described with reference to FIG. 10 to FIG. 27, as well as with reference to the aforementioned drawings. Repeated description of the same constituent elements as those described above will be omitted, and the differences will be mainly described.

Figure 10:
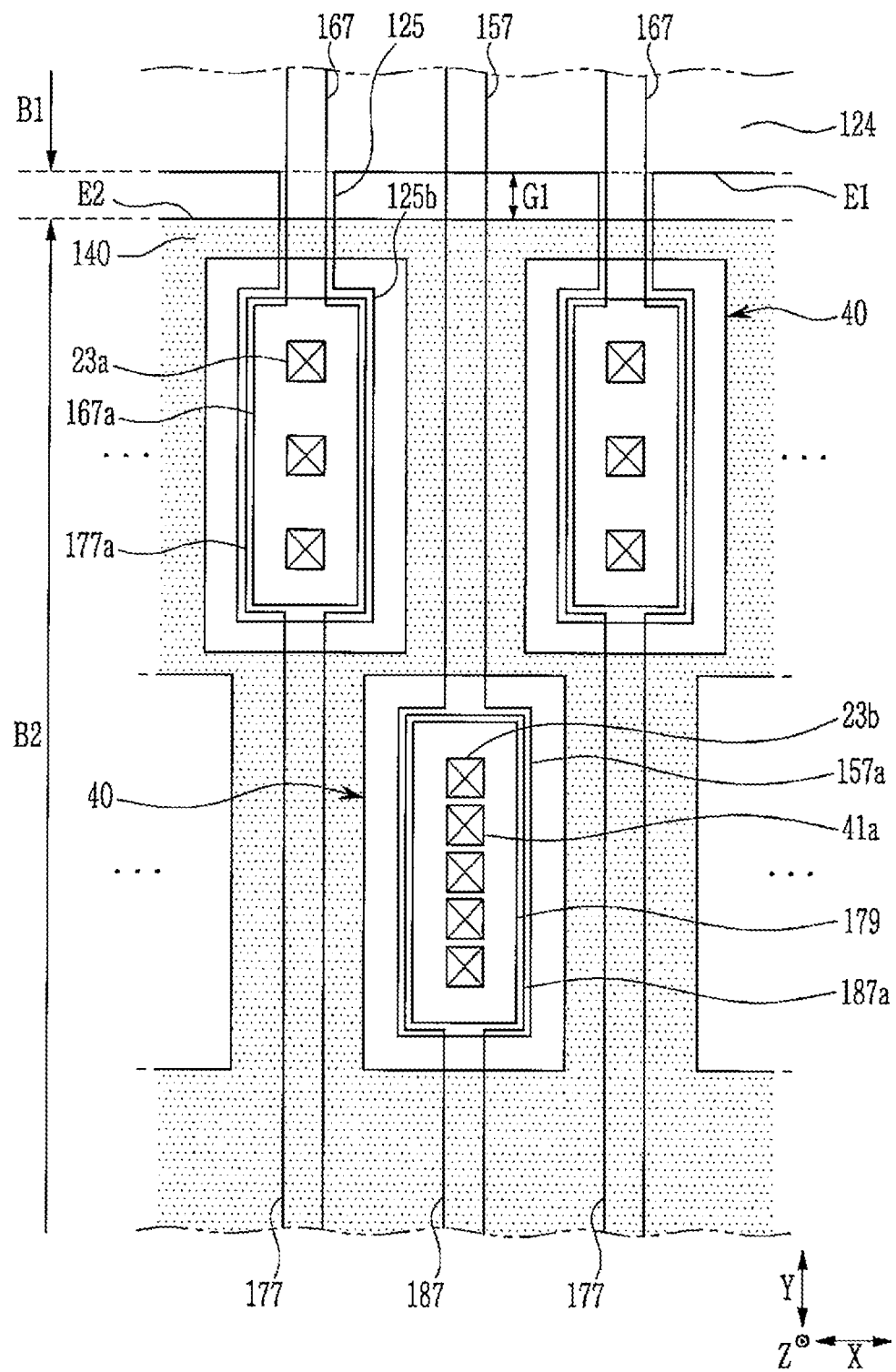
FIG. 10 and FIG. 11 are plan layout views expanding the area A1 or A2 of the display panel illustrated in FIG. 1.

First, referring to FIG. 10, the display panel according to the present embodiment is the same as most of the display panel according to the aforementioned embodiment of FIG. 3 to FIG. 5. However, the protector 125 may include an expansion 125b instead of the expansion 125a described above. The expansion 125b may extend further downward than the above-described expansion 125a, and may overlap the entire expansion 167a of the second signal wire 167 to cover the expansion 167a and a periphery thereof. The expansion 125b may overlap all of a plurality of contact holes 23a located on the expansion 167a of the second signal wire 167. A width of the expansion 125b may be greater than that of the expansion 167a at a portion where the expansion 125b overlaps the expansion 167a of the second signal wire 167. An edge of the expansion 125b may extend in parallel with the edge of the expansion 167a.

According to the present embodiment, the third insulating layer 123 located over the expansion 167a of the second signal wire 167 positioned in the opening 40 and an upper portion thereof may be covered and protected, not only by the expansion 177a of the third signal wire 177 that is the third conductive layer, but also by the expansion 125b of the protector 125. Therefore, the third insulating layer 123 located over the expansion 167a of the second signal wire 167 may be further protected to reduce or prevent a defect such as a crack from occurring in or around the third insulating layer 123, or to prevent the expansion 167a from being defective such as by being corroded by moisture and the like.

Figure 11:
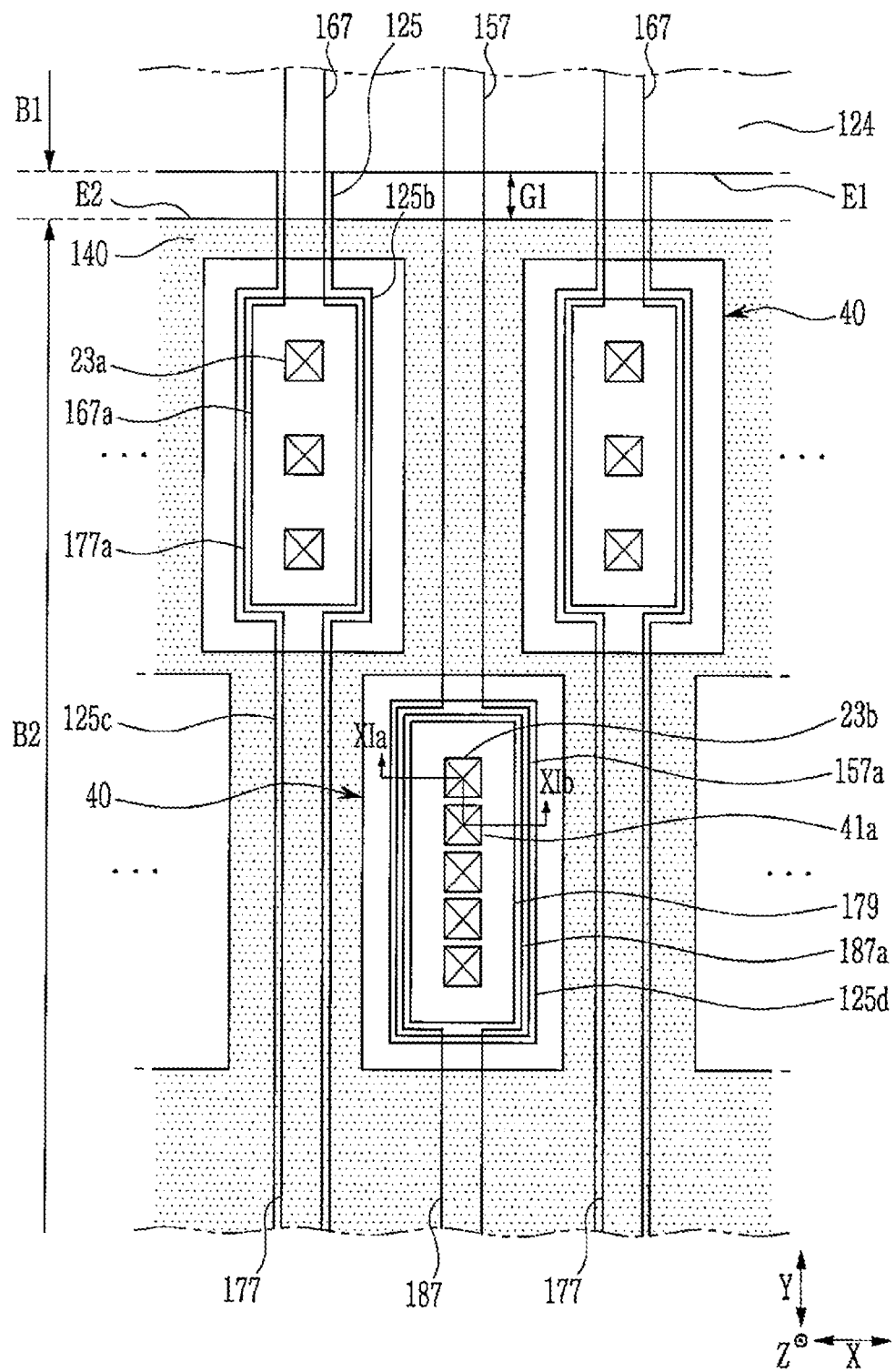

Hereinafter, referring to FIG. 11 and FIG. 12, the display panel according to the present embodiment is the same as most of the display panel according to the aforementioned embodiment of FIG. 10. However, the protector 125 may further include an extension 125c connected below the expansion 125b (e.g., below in a plan view). The extension 125c may extend along the third signal wire 177 positioned below the expansion 177a to cover the third signal wire 177 and a periphery thereof. In addition, the fifth insulating layer 124 may further include the connecting member 179 located in the third conductive layer, and a protector 125d configured to cover and overlap a periphery thereof.

A width of the extension 125c may be greater than that of the third signal wire 177 at a portion where the extension 125c overlaps the third signal wire 177. Similarly, a width of the protector 125d may be greater than that of the connecting member 179 at a portion where the protector 125d overlaps the connecting member 179. An edge of the extension 125c may extend substantially in parallel with an edge of the third signal wire 177, and an edge of the protector 125d may extend substantially in parallel with an edge of the connecting member 179.

Figure 12:
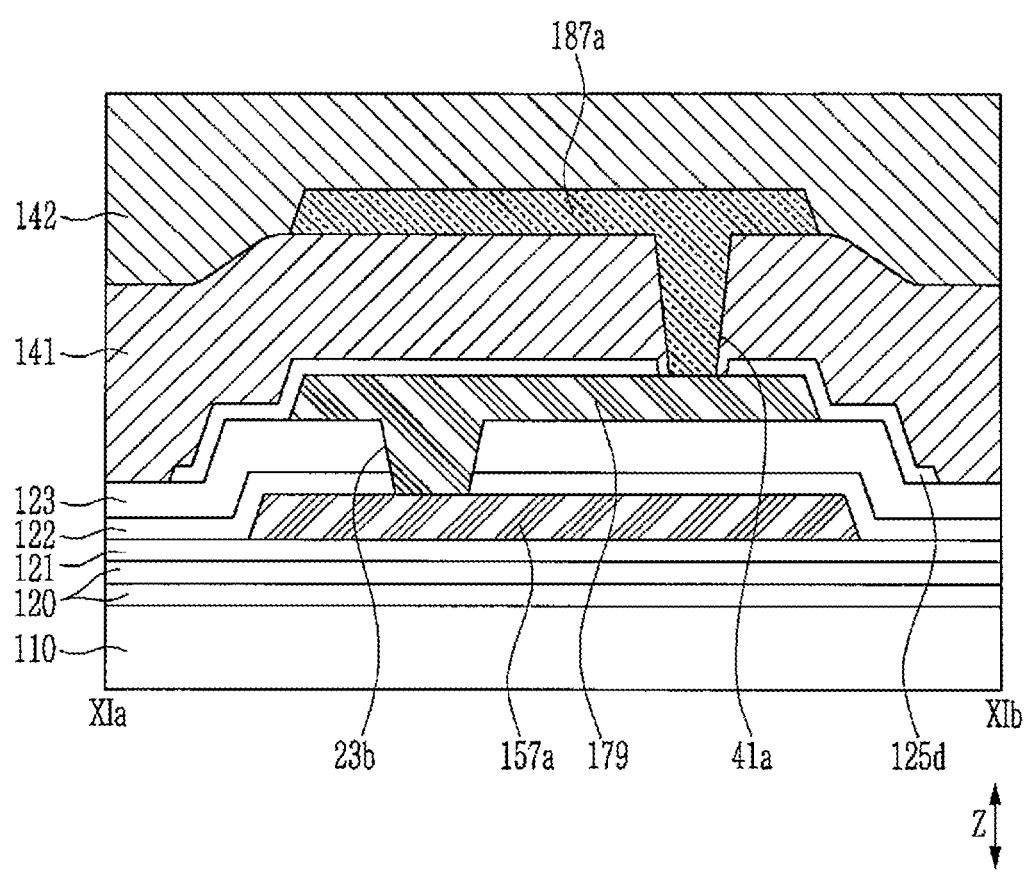
FIG. 12 is a cross-sectional view taken along the line XIa-XIb illustrating the display panel according to the embodiment of FIG. 11.

Referring to FIG. 12, the fifth insulating layer 124 (i.e., the protector 125d and the like, which covers a top portion of the third conductive layer in the second region B2) may cover side surfaces as well as top surfaces of the third signal wire 177, the connecting member 179, and the like. The protector 125d may have a portion that contacts a top surface of the third insulating layer 123.

Therefore, the fifth insulating layer 124 (i.e., the protector 125 and the protector 125d) positioned in the second region B2 may be located on the third signal wire 177, which is the third conductive layer, the connecting member 179, and a top portion of a periphery thereof to protect the third conductive layer, and to reduce or prevent corrosion of the third conductive layer by moisture and the like.

Figure 13:
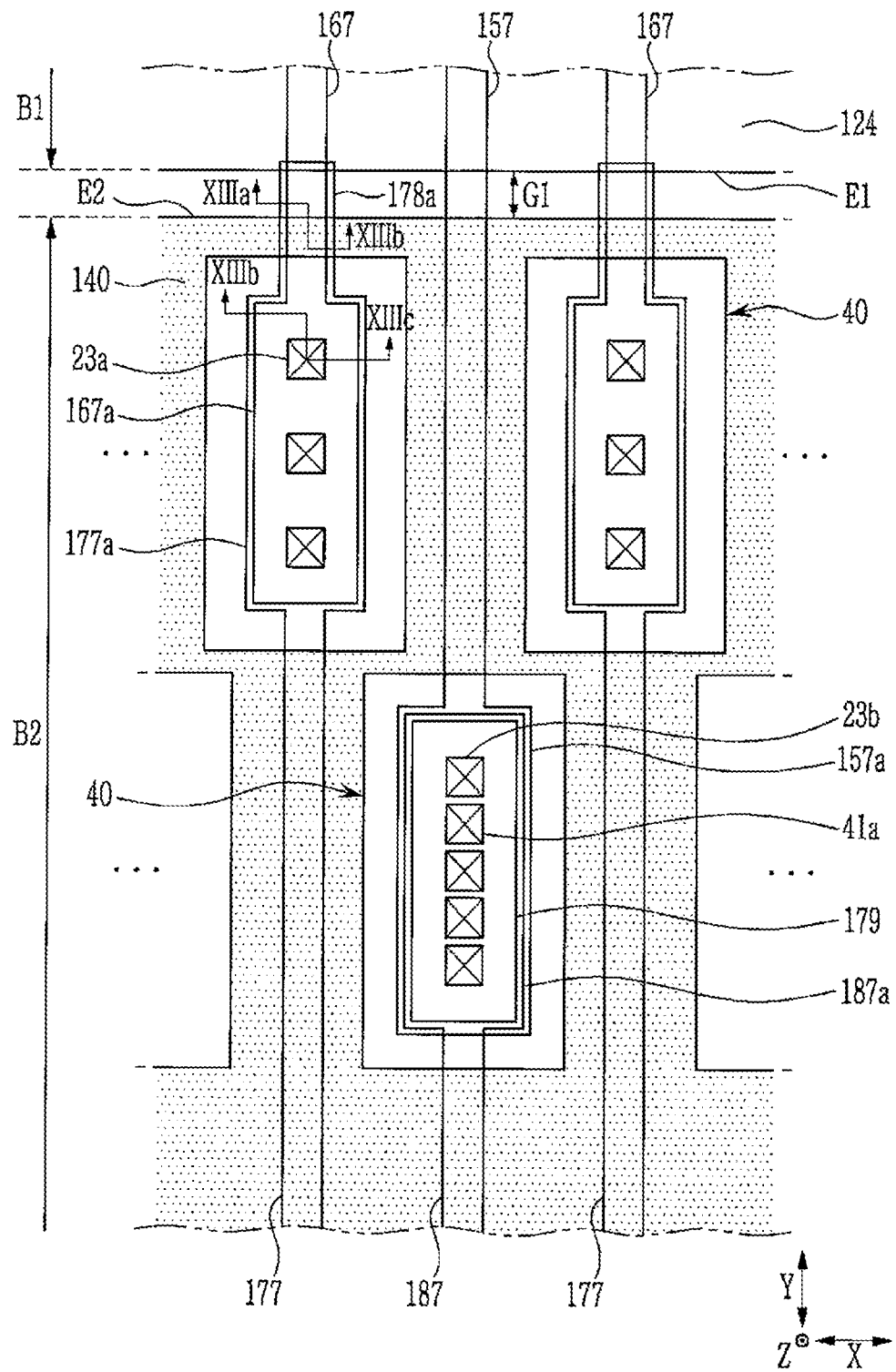
FIG. 13 is a plan layout view expanding the area A1 or A2 of the display panel illustrated in FIG. 1.
Figure 14:
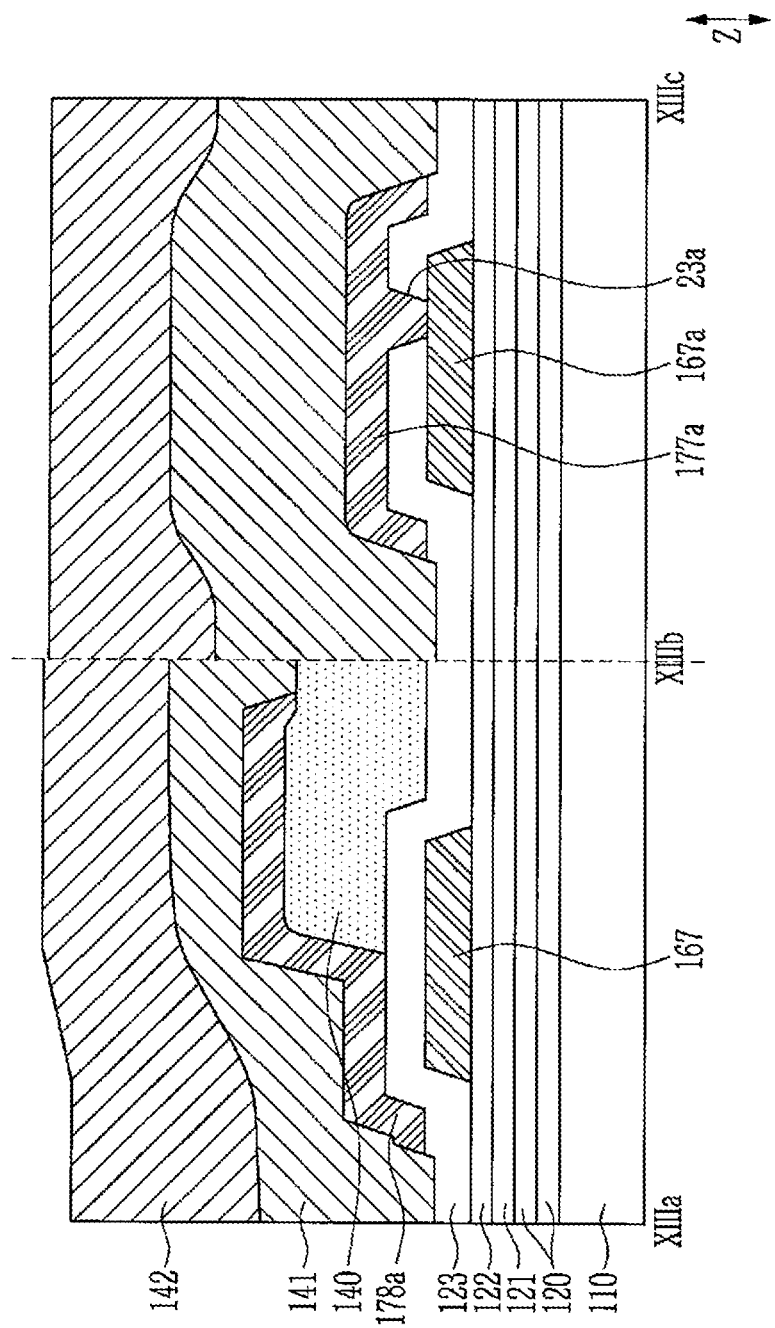
FIG. 14 is a cross-sectional view taken along lines XIIIa-XIIIb-XIIIc illustrating the display panel according to the embodiment of FIG. 13.

Hereinafter, referring to FIG. 13 and FIG. 14, the display panel according to the present embodiment is the same as most of the display panel according to the aforementioned embodiment of FIG. 3 to FIG. 5. However, instead of the protector 125, the third conductive layer may include a protector 178a that covers and overlaps a portion of the second signal wire 167 positioned in the gap G1 and in the opening 40, and a periphery thereof. The protector 178a may have a shape that upwardly protrudes from the expansion 177a in a plan view, and may be located in a same layer as the expansion 177a in a cross-sectional view, that is, in the third conductive layer. A portion of the second signal wire 167 in the gap G1 and a portion that overlaps the opening 40 of the fourth insulating layer 140, but does not overlap the expansion 177a of the third signal wire 177 serving as the third conductive layer, may be positioned in a region occupied by the protector 178a. A width of the protector 178a may be greater than that of the second signal wire 167 at a portion where the protector 178a overlaps the second signal wire 167. The protector 178a may have a portion that contacts an upper surface of the third insulating layer 123.

An edge of the protector 178a may extend substantially in parallel with an edge of the second signal wire 167 positioned in the gap G1 and in the opening 40.

In addition, in the present embodiment, the function of the protector 178a is the same as that of the protector 125 described above, and thus a detailed description thereof will be omitted.

Figure 15:
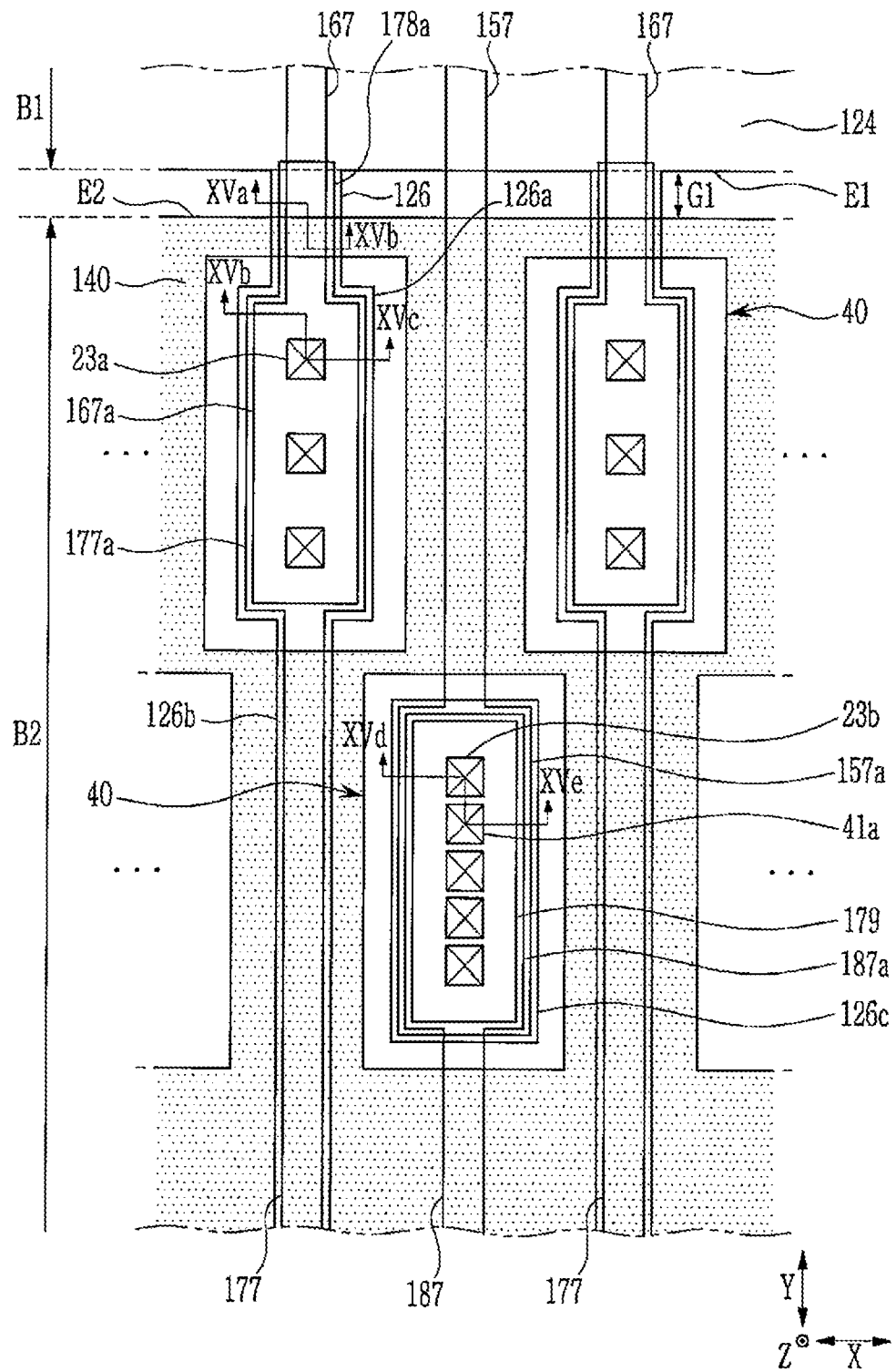
FIG. 15 is a plan layout view expanding the area A1 or A2 of the display panel illustrated in FIG. 1.

Hereinafter, referring to FIG. 15 to FIG. 17, the display panel according to the present embodiment is the same as most of the display panel according to the aforementioned embodiment of FIG. 13 and FIG. 14. However, the fifth insulating layer 124 may further include a portion that covers and overlaps the third conductive layer (i.e., may cover the third signal wire 177, the protector 178a, and the connecting member 179, positioned in the gap G1 and the second region B2, and a periphery thereof). For example, the present embodiment may further include a protector 126 having a shape that protrudes from the fifth insulating layer 124 of the first region B1, and a protector 126c having an island-like shape that is separated from the protector 126 in a plan view.

The protector 126 may include a portion covering the protector 178a positioned in the third conductive layer and a periphery thereof, an expansion 126a overlapping the entirety of the expansion 177a of the third signal wire 177 and covering the expansion 177a and a periphery thereof, and an extension 126b that is connected to the lower portion of the expansion 126a, that extends along the third signal wire 177, and that covers the third signal wire 177 and a periphery thereof. The protector 126c may cover and overlap the connecting member 179 located in the third conductive layer and a periphery thereof.

A width of the protector 126 may be greater than that of the third signal wire 177 and the protector 178a at respective portions where the protector 126 overlaps the third signal wire 177 and the protector 178a. Similarly, a width of the protector 126c may be greater than that of the connecting member 179 at a portion where the protector 126c overlaps the connecting member 179. An edge of the protector 126 may extend substantially in parallel with edges of the third signal wire 177 and the protector 178a, and an edge of the protector 126c may extend substantially in parallel with an edge of the connecting member 179.

Figure 16:
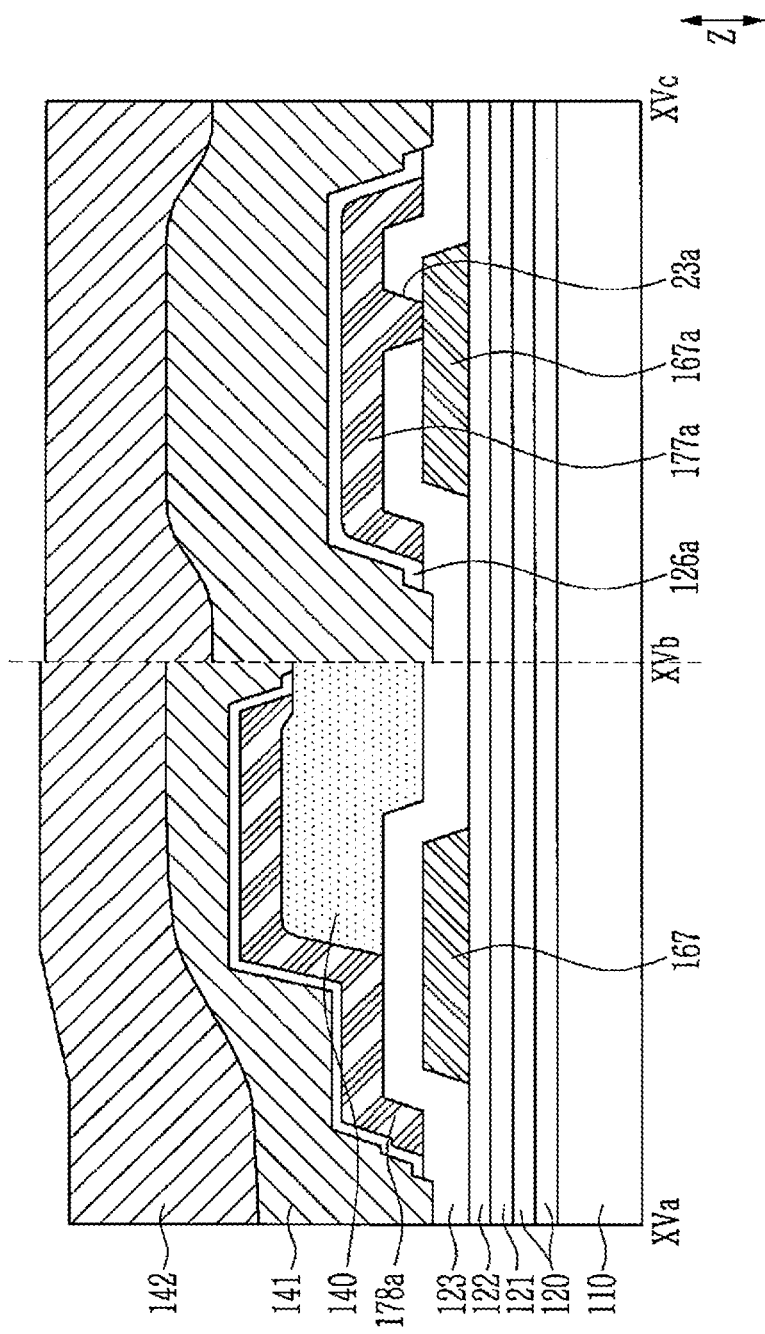
FIG. 16 is a cross-sectional view taken along lines XVa-XVb-XVc illustrating the display panel according to the embodiment of FIG. 15.
Figure 17:
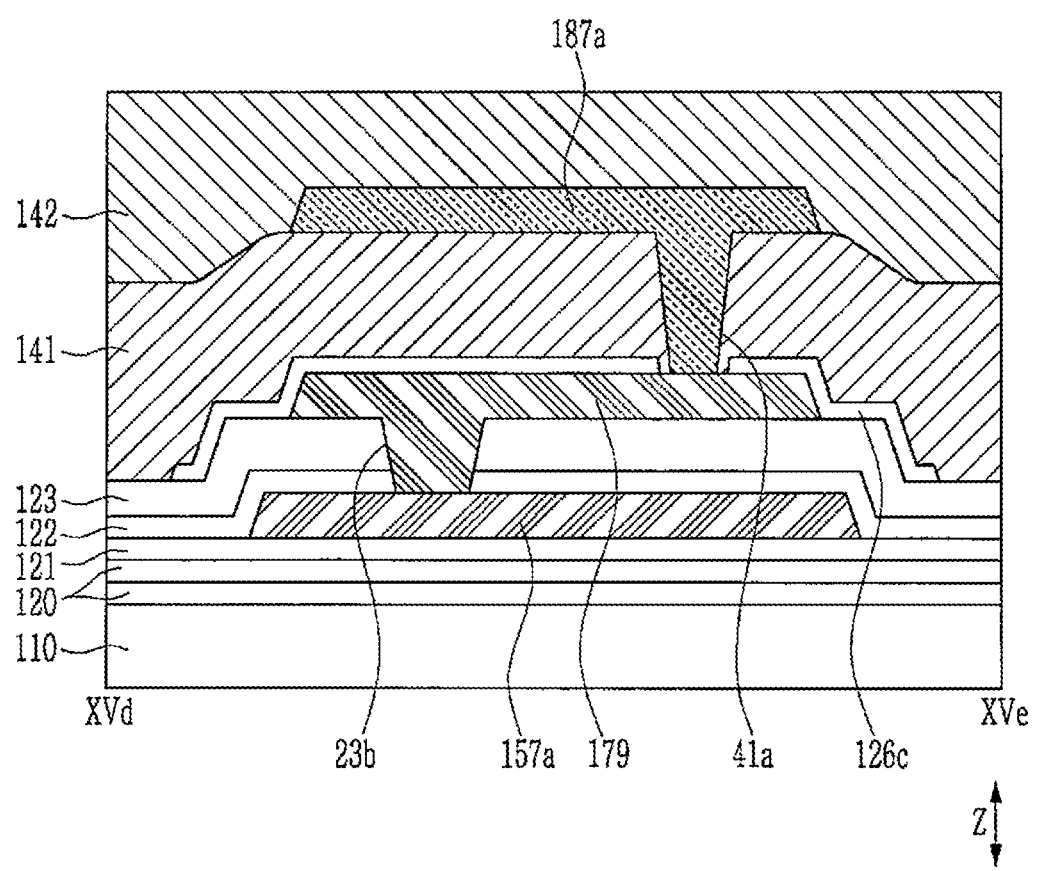
FIG. 17 is cross-sectional view taken along the line XVd-XVe illustrating the display panel according to the embodiment of FIG. 15.

Referring to FIG. 16 and FIG. 17, the fifth insulating layer 124 (i.e., the protector 126 and the protector 126c covering an upper portion of the third conductive layer in the second region B2) may cover side surfaces as well as top surfaces of the third signal wire 177, the protector 178a, the connecting member 179, and the like. The protector 126 and the protector 126c have a portion that contacts a top surface of the third insulating layer 123.

Therefore, the fifth insulating layer 124 (i.e., the protector 126 and the protector 126c positioned in the second region B2) may be located above the third signal wire 177 that is the third conductive layer, the protector 178a, the connecting member 179, and a top portion of a periphery thereof to protect the third conductive layer, and to reduce or prevent corrosion the third conductive layer by moisture and the like.

Hereinafter, referring to FIG. 18 to FIG. 20, the display panel according to the present embodiment is the same as most of the display panel according to the aforementioned embodiment of FIG. 3 to FIG. 5. However, the third signal wire 177 may be electrically connected to a fifth signal wire 158, and the fourth signal wire 187 may be electrically connected to a sixth signal wire 168. The fifth signal wire 158 may include an expansion 158a positioned at an end portion thereof, and the sixth signal wire 168 may include an expansion 168a at an end portion thereof. The expansion 158a of the fifth signal wire 158 may overlap the expansion 177a of the third signal wire 177 in a plan view to be electrically connected to the expansion 177a through a contact hole 23a. The expansion 168a of the sixth signal wire 168 may overlap the expansion 187a of the fourth signal wire 187 and the connecting member 179 of the third conductive layer in a plan view. The expansion 168a and the expansion 187a may be electrically connected to each other through contact holes 23b and 41a.

In addition, structures of the fifth signal wire 158 and the sixth signal wire 168 are respectively the same as those of the second signal wire 167 and the first signal wire 157. However, a difference may be made in that the fifth signal wire 158 is positioned in the first conductive layer, and the sixth signal wire 168 is positioned in the second conductive layer.

As described above, the fifth signal wire 158 and the sixth signal wire 168 may be included in the data lines 171, but the present invention is not limited thereto. They may be included in signal lines for transferring different driving signals.

Because the second conductive layer that overlaps the gap G1 and the opening 40 of the fourth insulating layer 140 in the second region B2 includes the sixth signal wire 168, a protector positioned over the sixth signal wire 168 that overlaps the gap G1 and the opening 40 of the fourth insulating layer 140 in the second region B2 may be suitable in other embodiments.

Figure 18:
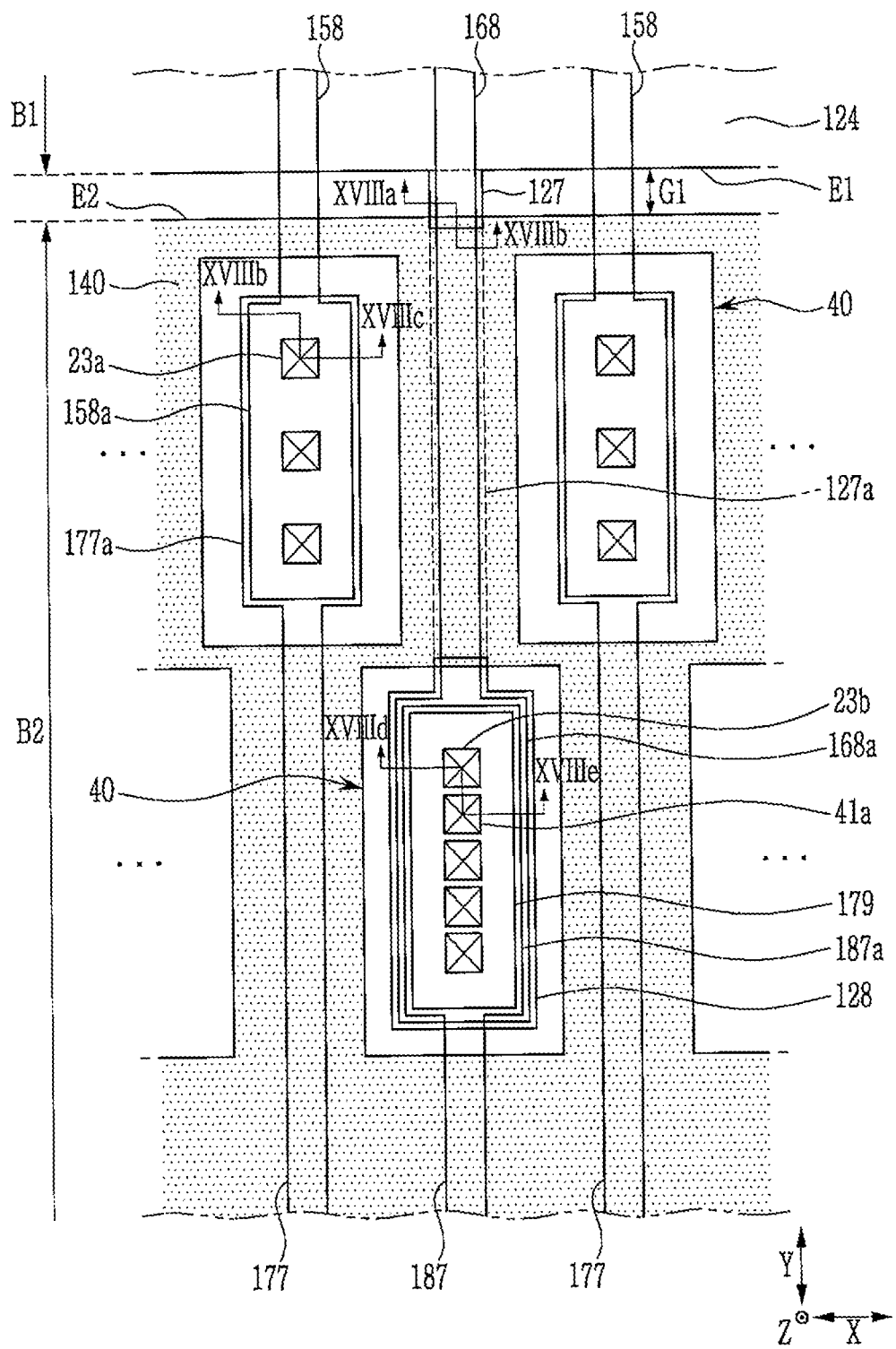
FIG. 18 is a plan layout view expanding the area A1 or A2 of the display panel illustrated in FIG. 1.
Figure 19:
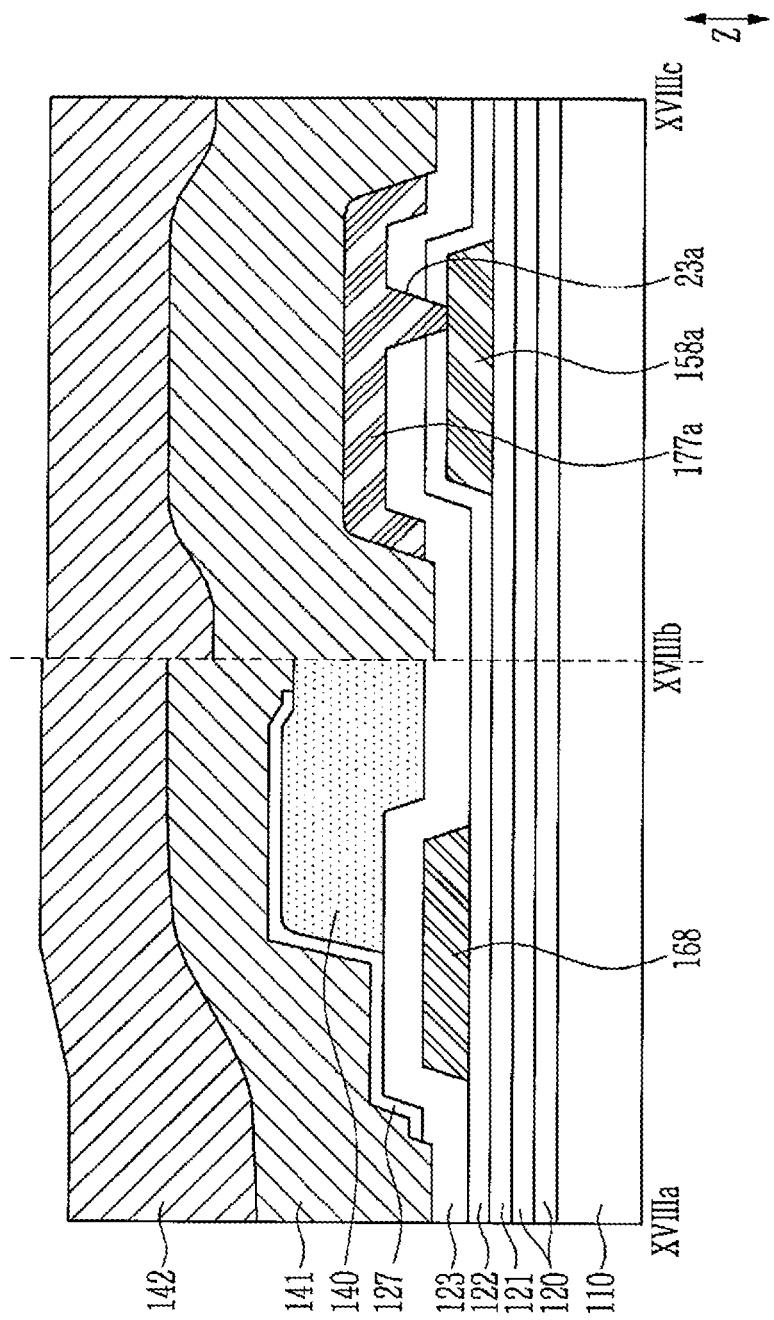
FIG. 19 is a cross-sectional view taken along lines XVIIIa-XVIIIb-XVIIIc illustrating the display panel according to the embodiment of FIG. 18.
Figure 20:
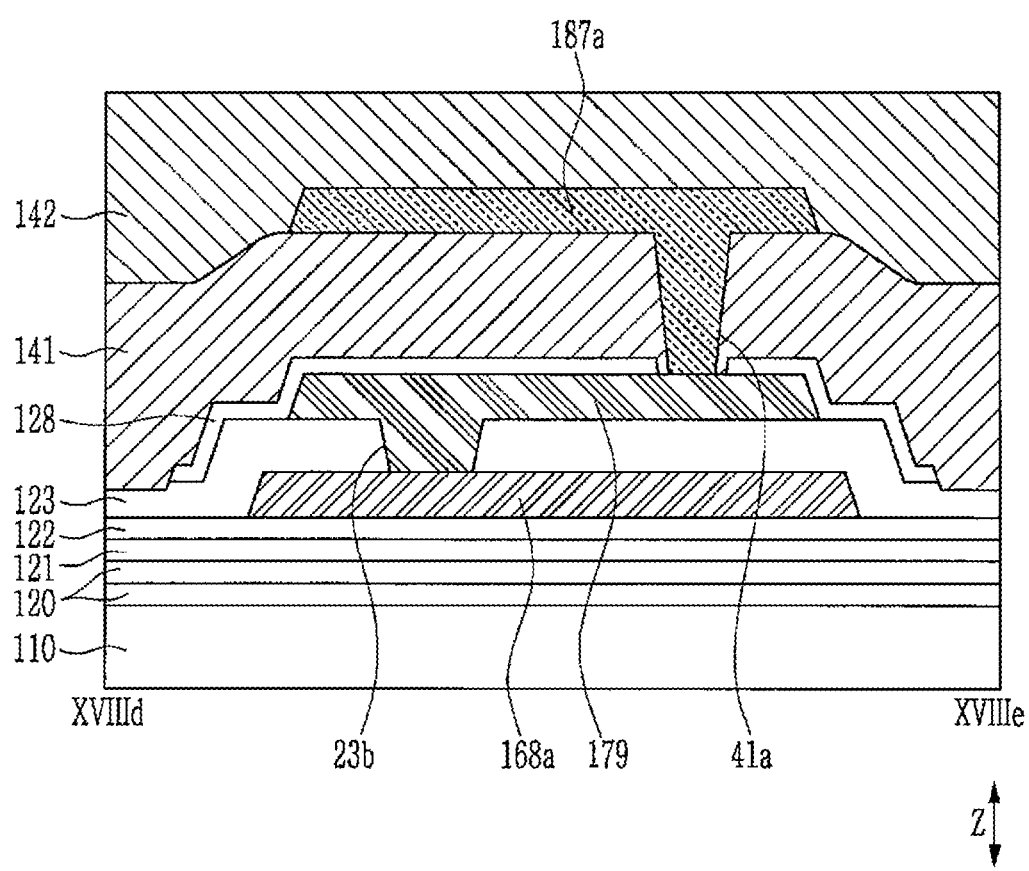
FIG. 20 is a cross-sectional view taken along the line XVIIId-XVIIIe illustrating the display panel according to the embodiment of FIG. 18.

Referring to FIG. 18 to FIG. 20, the fifth insulating layer 124 may include a protector 127 that overlaps the gap G1, and a protector 128 positioned in the opening 40 of the fourth insulating layer 140 in the second region B2. In a plan view, the protector 127 may have a shape that protrudes from the fifth insulating layer 124 positioned in the first region B1, and the protector 128 may have an island-like shape that is separated from the protector 127. Alternatively, as illustrated by a dotted line in FIG. 18, the fifth insulating layer 124 may further include an extension 127a for connecting between the protector 127 and the protector 128.

The protector 127 may cover and overlap a portion of the sixth signal wire 168 located in the second conductive layer, which is positioned in the gap G1, and a periphery thereof. The protector 128 may cover and overlap the sixth signal wire 168 that overlaps the opening 40 of the fourth insulating layer 140 in the second region B2, and a periphery thereof. For example, in a plan view, when the entire expansion 168a of the sixth signal wire 168 is not covered by the connecting member 179 of the third conductive layer, and a width of the expansion 168a of the sixth signal wire 168 is smaller than that of the connecting member 179, the protector 128 may cover and overlap the entire expansion 168a of the sixth signal wire 168 and a periphery thereof.

In other words, a portion of the sixth signal wire 168, which is positioned in the gap G1, and a portion thereof that overlaps the opening 40 of the fourth insulating layer 140, may be positioned in a region occupied by the protectors 127 and 128. Widths of the protectors 127 and 128 may be greater than that of the sixth signal wire 168 at a portion where the protectors 127 and 128 overlap the sixth signal wire 168. The protectors 127 and 128 may include portions that contact an upper surface of the third insulating layer 123. An edge of the protector 127 may extend substantially in parallel with an edge of the sixth signal wire 168 positioned in the gap G1, and an edge of the protector 128 may extend substantially in parallel with an edge of the sixth signal wire 168 overlapping the opening 40.

In addition, in the present embodiment, the functions of the protectors 127 and 128 are the same as those of various protectors such as the protector 125 described above, and thus a detailed description thereof will be omitted.

Figure 21:
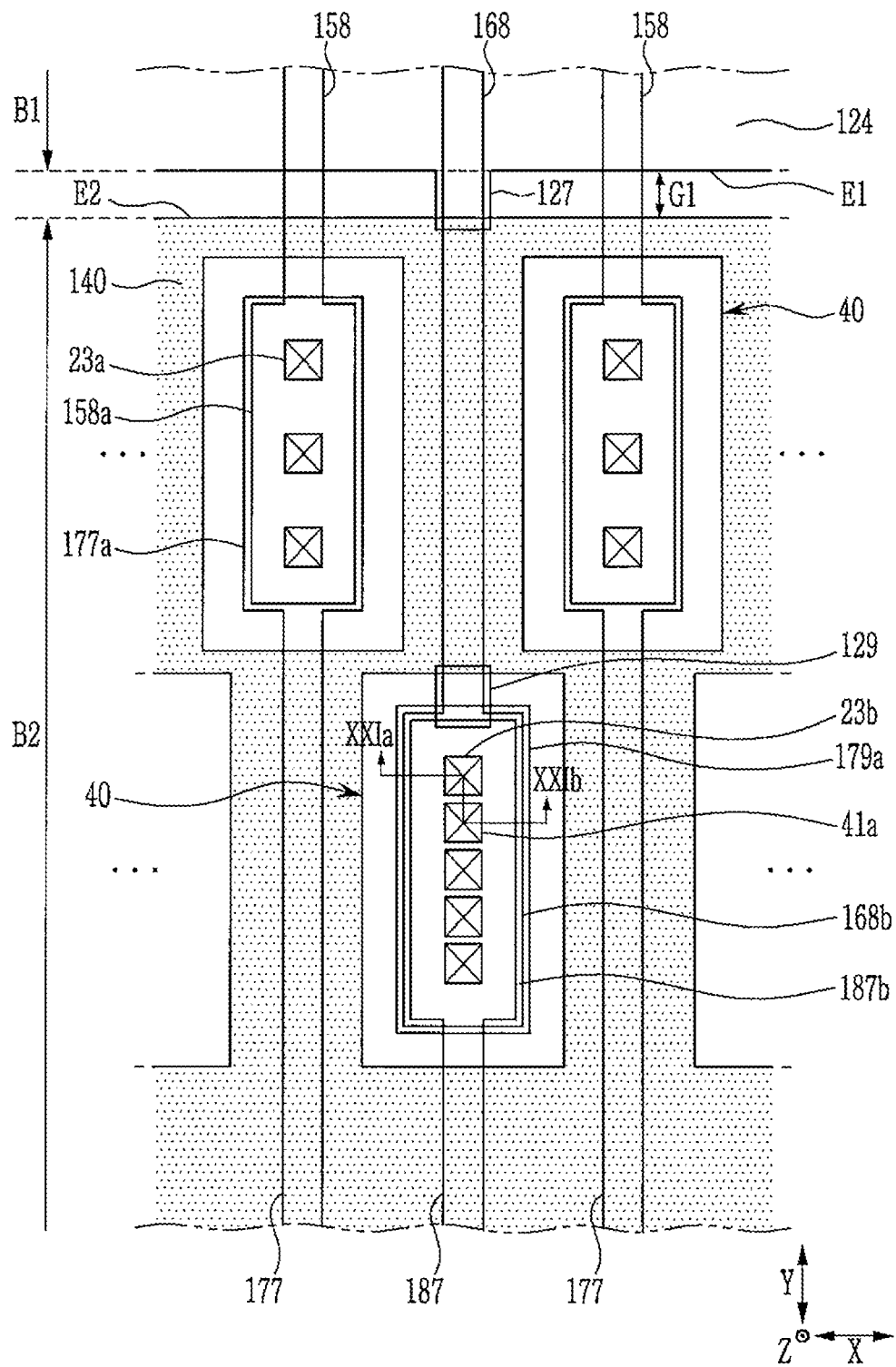
FIG. 21 is a plan layout view expanding the area A1 or A2 of the display panel illustrated in FIG. 1.
Figure 22:
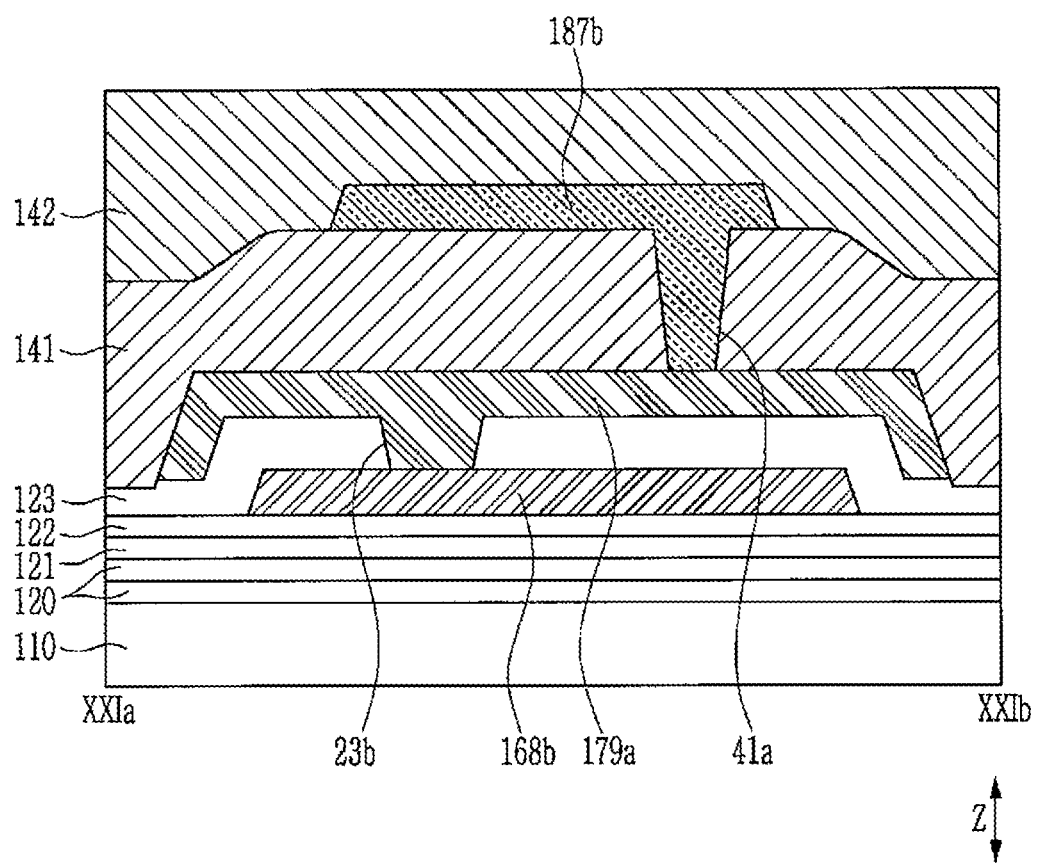
FIG. 22 is a cross-sectional view taken along the line XXIa-XXIb illustrating the display device according to the embodiment of FIG. 21.

Hereinafter, referring to FIG. 21 and FIG. 22, the display panel according to the present embodiment is the same as most of the display panel according to the aforementioned embodiment of FIG. 18 to FIG. 20. However, the fifth insulating layer 124 may include a protector 129 instead of the protector 128. The protector 129 may restrictively cover and overlap a portion of the sixth signal wire 168, which is positioned in the opening 40 of the fourth insulating layer 140 and is not covered by a connecting member 179a, and a periphery thereof. The connecting member 179a is substantially the same as the connecting member 179 described above, but may cover an expansion 168b of the sixth signal wire 168 and a periphery thereof, and may have a greater width than that of the expansion 168b. An edge of the protector 129 may be positioned in the opening 40 to extend substantially in parallel with the edge of the sixth signal wire 168 that is not covered by the connecting member 179a, and an edge of the connecting member 179a may extend substantially in parallel with the edge of the expansion 168b.

In addition, the expansion 168b may be substantially the same as that of the aforementioned expansion 168a. An expansion 187b of the fourth signal wire 187 may be substantially the same as that of the aforementioned expansion 187a.

In the present embodiment, the third insulating layer 123 located in most upper portions of the expansion 168b of the sixth signal wire 168 positioned in the opening 40 may be covered and protected by the connecting member 179a that is the third conductive layer instead of the fifth insulating layer 124, unlike in the aforementioned embodiment. In other words, in the opening 40, the third insulating layer 123 located in the expansion 168b of the sixth signal wire 168 and a top portion of a periphery thereof may be covered and protected by the connecting member 179a that is the third conductive layer. As described above, the third insulating layer 123 located at a portion of the sixth signal wire 168 positioned in the opening 40, which is not covered by the connecting member 179a, and a top portion of a periphery thereof may be covered and protected by the protector 129 of the fifth insulating layer 124. The connecting member 179a and the protector 129 may include portions that contact an upper surface of the third insulating layer 123.

In addition, in the present embodiment, the function of the protector 129 is the same as that of various protectors such as the protector 125 described above, and thus a detailed description thereof will be omitted Hereinafter, referring to FIG. 23 and FIG. 24, the display panel according to the present embodiment is the same as most of the display panel according to the aforementioned embodiment of FIG. 18 to FIG. 20. However, the fifth insulating layer 124 may further include a protector 125e that covers and overlaps the third signal wire 177 positioned in the second region B2 and a periphery thereof. The protector 125e may include an expansion 126e that covers and overlaps the expansion 177a of the third signal wire 177 and a periphery thereof. The protector 125e including the expansion 126e may be separated from the fifth insulating layer 124 of the first region B1 and the protector 128. An edge of the protector 125e may extend substantially in parallel with the edge of the third signal wire 177 positioned in the second region B2.

Figure 24:
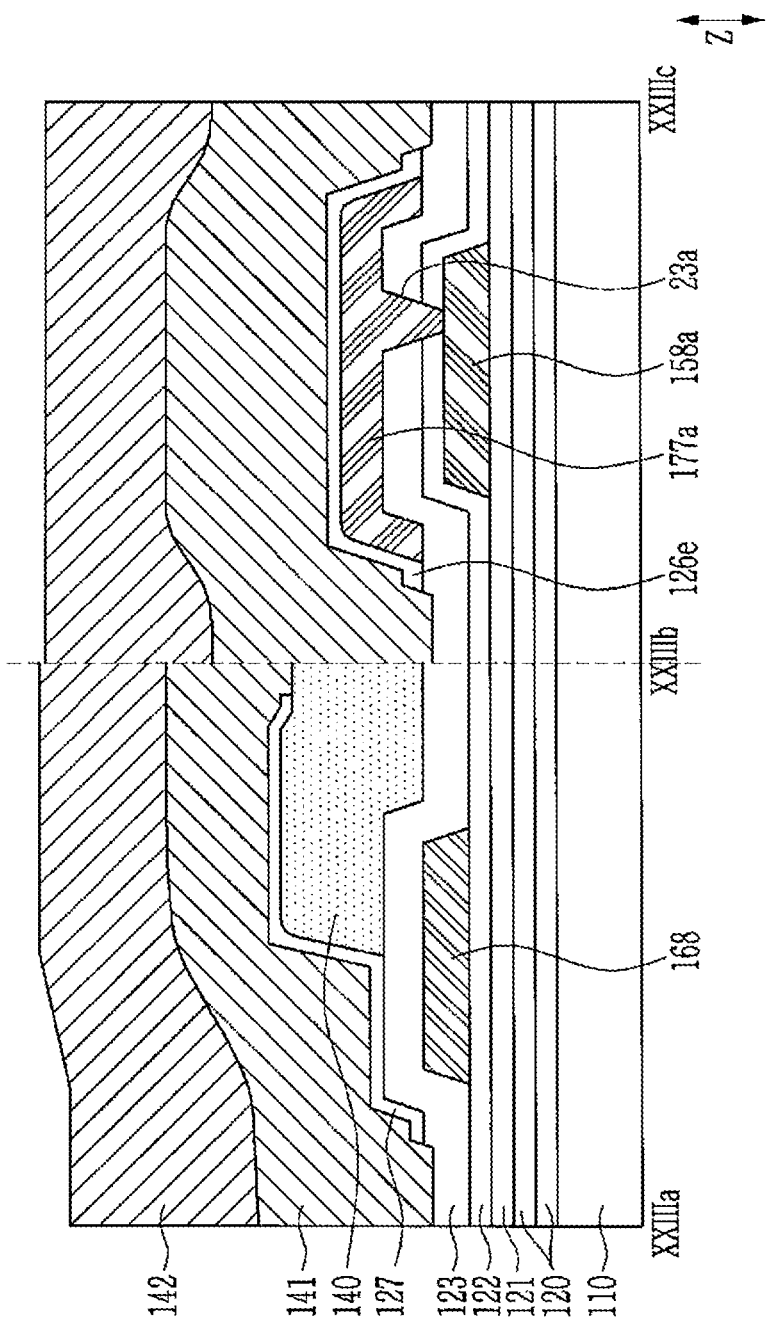
FIG. 24 is a cross-sectional view taken along lines XXIIIa-XXIIIb-XXIIIc illustrating the display panel according to the embodiment of FIG. 23.

Referring to FIG. 24, the fifth insulating layer 124 (i.e., the protector 125e including the expansion 126e, or the like, covering an upper portion of the third conductive layer in the second region B2) may cover side surfaces as well as top surfaces of the third signal wire 177, the connecting member 179, and the like.

The protector 128 may not only cover the sixth signal wire 168 positioned in the opening 40 and a periphery thereof, but may also cover the connecting member 179 that is the third conductive layer and a periphery thereof. The protectors 125e, 127, and 128 have a portion that contacts a top surface of the third insulating layer 123.

Therefore, the fifth insulating layer 124 (i.e., the protector 125e and the protector 128) positioned in the second region B2 may be located above the third signal wire 177 that is the third conductive layer, the connecting member 179, and a top portion of a periphery thereof to protect the third conductive layer, and to reduce or prevent corrosion of the third conductive layer by moisture and the like.

Hereinafter, referring to FIG. 25 to FIG. 26, the display panel according to the present embodiment is the same as most of the display panel according to the aforementioned embodiment of FIG. 21 and FIG. 22. However, instead of the protectors 127 and 129, the third conductive layer may include protectors 179b and 179c that cover and overlap a sixth signal wire 168 positioned in the gap G1 and the opening 40 and a periphery thereof, as in the embodiment of FIG. 13 and FIG. 14.

The protector 179b may have a shape that upwardly protrudes from the connecting member 179a in a plan view, and may be located in a same layer as the connecting member 179a in the cross-sectional structure, that is, the third conductive layer. The protector 179c may have an island-like shape that is separated from the protector 179b, and may cover and overlap a portion of the sixth signal wire 168 that is positioned in the gap G1 and a periphery thereof.

A portion of the sixth signal wire 168, which is positioned in the gap G1, and a portion thereof that overlaps the opening 40 of the fourth insulating layer 140 and does not overlap the connecting member 179a of the third conductive layer, may be positioned in a region occupied by the protectors 179b and 179c. Widths of the protectors 179b and 179c may be greater than that of the sixth signal wire 168 at a respective portions where the protectors 179b and 179c overlap the sixth signal wire 168 including the expansion 168b. Each edge of the protectors 179b and 179c may extend in parallel with the edge of the sixth signal wire 168 positioned in the gap G1 and the opening 40.

The protectors 179b and 179c and the expansion 177a may include portions that contact an upper surface of the third insulating layer 123.

Figure 25:
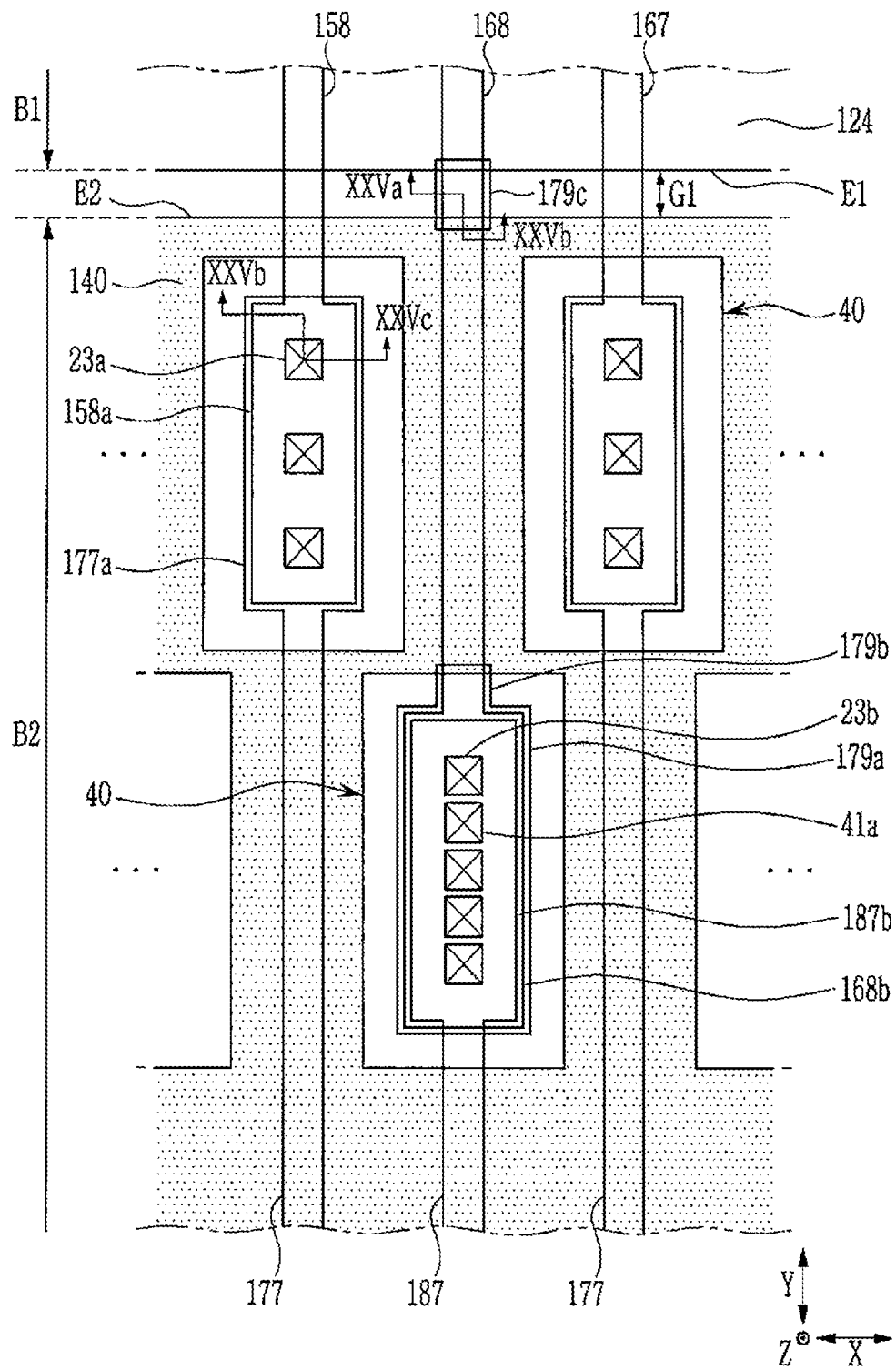
FIG. 25 is a plan layout view expanding the area A1 or A2 of the display panel illustrated in FIG. 1.
Figure 26:
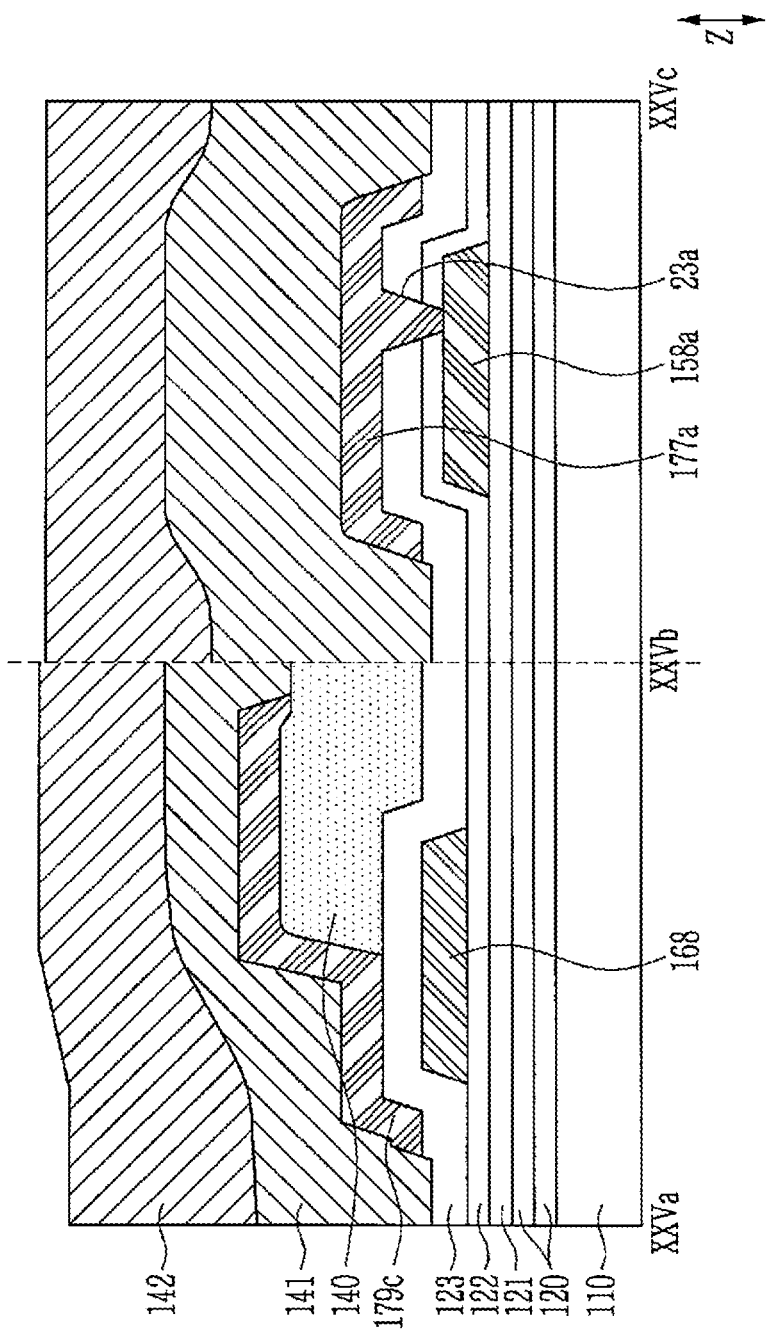
FIG. 26 is a cross-sectional view taken along lines XXVa-XXVb-XXVc illustrating the display panel according to the embodiment of FIG. 25.
Figure 27:
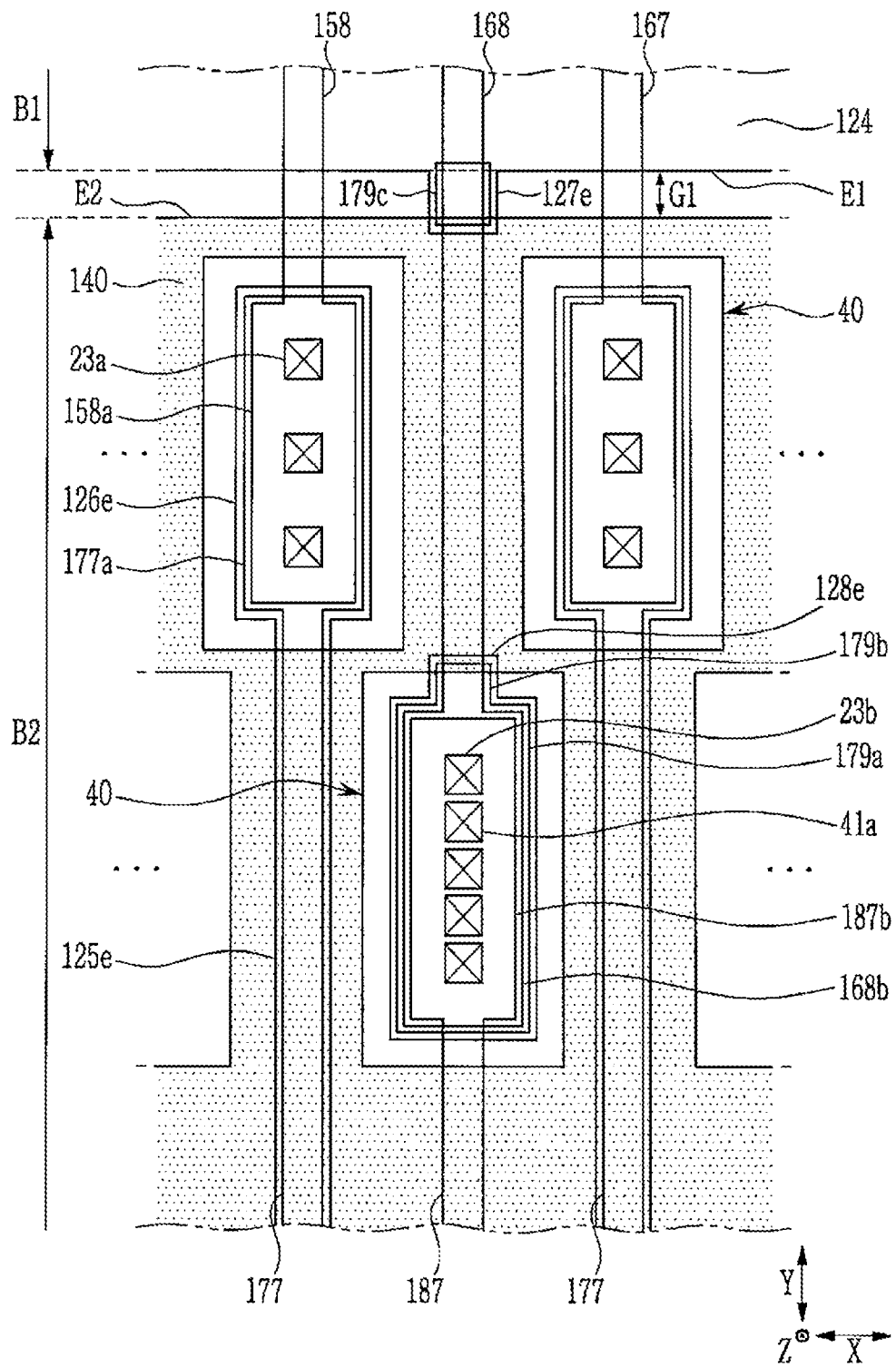
FIG. 27 is a plan layout view expanding the area A1 or A2 of the display panel illustrated in FIG. 1.

In addition, in the present embodiment, the function of the protectors 179b and 179c are the same as that of various protectors such as the protector 125 described above, and thus a detailed description thereof will be omitted Finally, referring to FIG. 27, the display panel according to the present embodiment is the same as most of the display panel according to the aforementioned embodiment of FIG. 25 and FIG. 26. However, the fifth insulating layer 124 may further include a portion that covers and overlaps the third conductive layer, i.e., the third signal wire 177, the connecting member 179a, and the protectors 179b and 179c positioned in the gap G1 and the second region B2, and a periphery thereof, as in the embodiments of FIG. 15 to FIG. 17 and FIG. 23 and FIG. 24. For example, the present embodiment may further include a protector 127e having a shape that protrudes from the fifth insulating layer 124 of the first region B1, a protector 128e having an island-like shape that is separated from the protector 127e, and the protector 125e that covers and overlaps the third signal wire 177 and a periphery thereof in a plan view.

Figure 23:
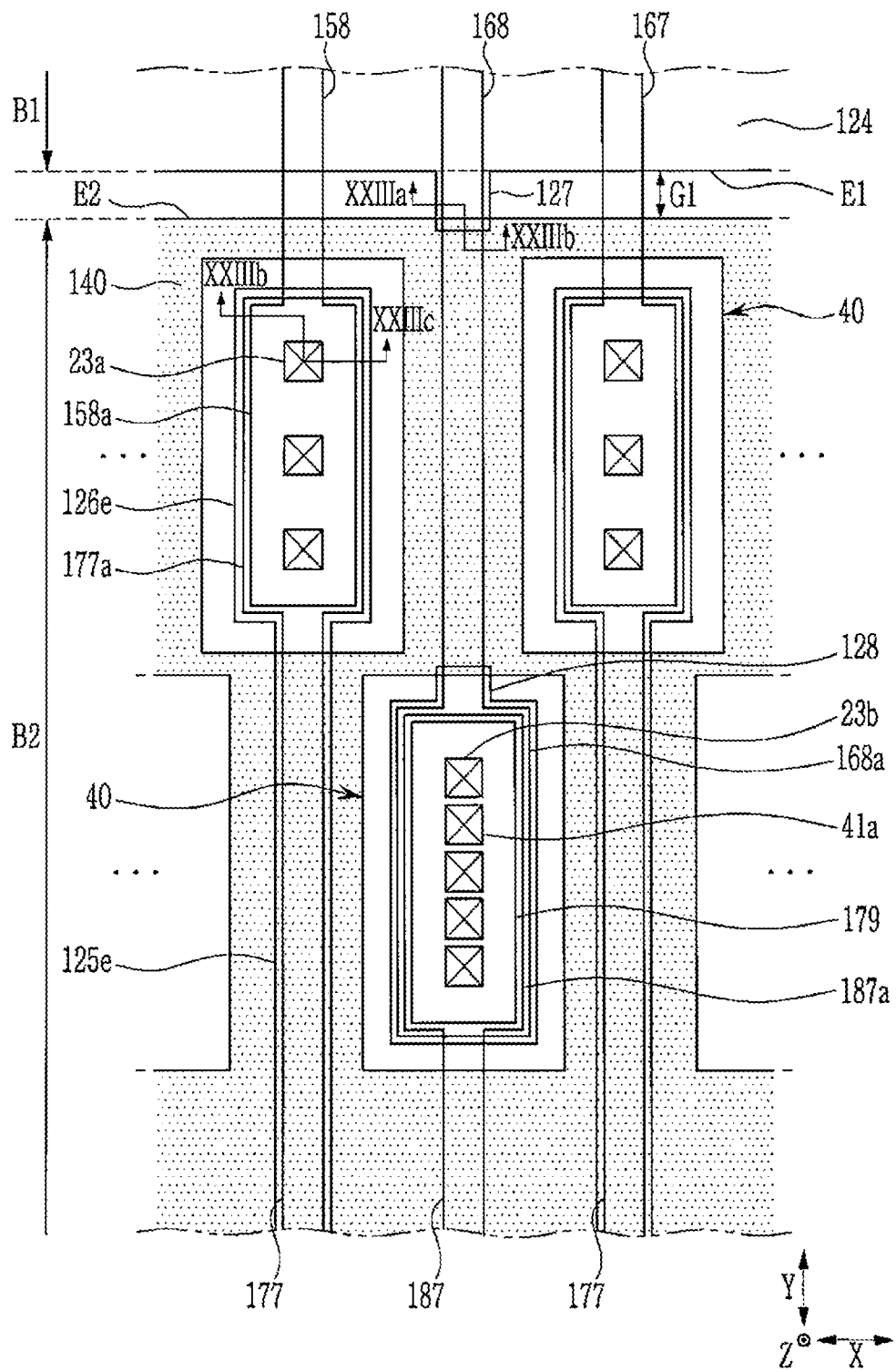
FIG. 23 is a plan layout view expanding the area A1 or A2 of the display panel illustrated in FIG. 1.

The protector 125e including the expansion 126e of the present embodiment may be substantially the same as the protector 125e according to the embodiment illustrated in FIG. 23 and FIG. 24.

The protector 127e of the present embodiment is substantially the same as the protector 127 of the embodiment illustrated in FIG. 23 and FIG. 24. For example, the protector 127e may cover and overlap the protector 179c that is the third conductive layer and a periphery thereof.

The protector 128e of the present embodiment is substantially the same as the protector 128 of the embodiment illustrated in FIG. 23 and FIG. 24. For example, the protector 128e may cover and overlap the protector 179b that is the third conductive layer and a periphery thereof.

Widths of the protectors 125e, 127e, and 128e may be greater than the width of the overlapping third conductive layer (i.e., the third signal wire 177, the protector 179b, the connecting member 179a, and the protector 179c at respective portions where the protectors 125e, 127e, and 128e overlap the third signal wire 177, the protector 179b, the connecting member 179a, and the protector 179c). The protectors 125e, 127e, and 128e may include portions that contact an upper surface of the third insulating layer 123.

Therefore, the fifth insulating layer 124 (i.e., the protectors 125e, 127e, and 128e, positioned in the second region B2) may be located above the third signal wire 177 that is the third conductive layer, the protector 179b, the connecting member 179a, and the protector 179c, and a top portion of a periphery thereof to protect the third conductive layer, and to reduce or prevent corrosion of the third conductive layer by moisture and the like.

The display device according to an embodiment may be an organic or inorganic emissive display device, but it is not limited thereto. For example, the display device may be various display devices such as a liquid crystal display.

While this invention has been described in connection with what is presently considered to be practical embodiments, it is to be understood that the invention is not limited to the disclosed embodiments, but, on the contrary, is intended to cover various modifications and equivalent arrangements included within the spirit and scope of the appended claims.

What is claimed is:

1. A display device comprising:
a substrate comprising a display area including a plurality of pixels, and a peripheral area positioned outside the display area and including a bending area;
a first conductive layer comprising a first signal wire over the substrate;
a first insulating layer over the first conductive layer;
a second insulating layer in a different layer from the first insulating layer, overlapping the bending area in a plan view, and having a first edge positioned around the bending area; and
a second conductive layer over the second insulating layer, the second conductive layer comprising a second signal wire that comprises a portion in the bending area,
wherein the first signal wire is in the peripheral area, crosses the first edge of the second insulating layer in the plan view, does not overlap the bending area, and comprises a first portion that does not overlap the second insulating layer in the plan view,
wherein the second conductive layer comprises a second portion that overlaps at least a portion of the first portion, and has an edge that is parallel with an edge of the first portion in the plan view, and
wherein a width of the second portion in a first direction is greater than a width of the first portion in the first direction.

2. The display device of claim 1, further comprising:
a protecting portion over the second insulating layer,
wherein the protecting portion contacts an upper surface of the first insulating layer.

3. The display device of claim 2, further comprising:
a third insulating layer over the second conductive layer,
wherein the third insulating layer has a first region having a second edge that faces the first edge of the second insulating layer, and that defines a gap between the first edge and the second edge,
wherein the first portion of the first signal wire comprises a third portion positioned in the gap, and
wherein the protecting portion comprises a first protecting portion that overlaps at least a portion of the third portion.

4. The display device of claim 3, wherein the second insulating layer defines an opening,
wherein the first portion of the first signal wire further comprises a fourth portion in the opening, and
wherein the protecting portion further comprises a second protecting portion that overlaps at least a portion of the fourth portion.

5. The display device of claim 4, wherein at least one of the first protecting portion and the second protecting portion is in the third insulating layer, and includes a same material as the third insulating layer.

6. The display device of claim 5, wherein the first protecting portion extends from the third insulating layer in the first region.

7. The display device of claim 5, wherein the second signal wire is electrically connected to the first signal wire in the opening,
wherein the first signal wire comprises a first expansion in the opening,
wherein the second signal wire comprises a second expansion that overlaps the first expansion, and that is electrically connected to the first expansion through a contact hole of the first insulating layer, and
wherein a width of the second expansion is greater than a width of the first expansion at a region where the second expansion overlaps the first expansion.

8. The display device of claim 7, further comprising a third protecting portion in the third insulating layer that overlaps the second signal wire overlapping the second insulating layer, that extends along the second signal wire, and that includes a same material as the third insulating layer.

9. The display device of claim 5, wherein the third insulating layer has a portion that overlaps the second conductive layer outside the first region.

10. The display device of claim 4, wherein at least one of the first protecting portion and the second protecting portion is in the second conductive layer and includes a same material as the second conductive layer.

11. The display device of claim 10, wherein the first signal wire comprises a first expansion positioned in the opening,
 wherein the second signal wire comprises a second expansion that overlaps the first expansion in the opening, and is electrically connected to the first expansion through a contact hole of the first insulating layer, and
 wherein a width of the second expansion is greater than a width of the first expansion at a region where the second expansion overlaps the first expansion.

12. The display device of claim 11, wherein the second protecting portion extends from the second expansion, and
 wherein the first protecting portion extends from the second protecting portion.

13. The display device of claim 11, wherein the third insulating layer has a portion that overlaps the second conductive layer outside the first region.

\* \* \* \* \*